(12) United States Patent  
Masuoka et al.

(10) Patent No.: US 9,312,396 B2  
(45) Date of Patent: *Apr. 12, 2016

(54) NONVOLATILE SEMICONDUCTOR MEMORY TRANSISTOR AND METHOD FOR MANUFACTURING NONVOLATILE SEMICONDUCTOR MEMORY

(71) Applicant: Unisantis Electronics Singapore Pte. Ltd., Peninsula Plaza (SG)

(72) Inventors: Fujio Masuoka, Tokyo (JP); Hiroki Nakamura, Tokyo (JP)

(73) Assignee: UNISANTIS ELECTRONICS SINGAPORE PTE LTD., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/837,615

(22) Filed: Aug. 27, 2015

(65) Prior Publication Data

US 2015/0364608 A1    Dec. 17, 2015

Related U.S. Application Data

(60) Continuation of application No. 13/898,982, filed on May 21, 2013, now Pat. No. 9,159,813, which is a division of application No. 13/163,319, filed on Jun. 17, 2011, now Pat. No. 8,471,327.

(60) Provisional application No. 61/367,903, filed on Jul. 27, 2010.

(30) Foreign Application Priority Data

Jul. 27, 2010   (JP) .................................. 2010-168148

(51) Int. Cl.  
*H01L 29/788* (2006.01)  
*H01L 21/28* (2006.01)  
*H01L 27/115* (2006.01)  
*H01L 29/66* (2006.01)

(52) U.S. Cl.  
CPC ...... *H01L 29/7889* (2013.01); *H01L 21/28273* (2013.01); *H01L 27/11521* (2013.01); *H01L 29/66825* (2013.01)

(58) Field of Classification Search  
CPC ................... H01L 29/66825; H01L 27/11521; H01L 29/7889  
USPC .................................................. 257/316–320  
See application file for complete search history.

(56) References Cited

U.S. PATENT DOCUMENTS

| 8,471,327 B2 * | 6/2013 | Masuoka ......... H01L 21/28273 257/316 |
| 2008/0277716 A1 | 11/2008 | Nishida et al. |
| 2008/0277720 A1 | 11/2008 | Youn et al. |

FOREIGN PATENT DOCUMENTS

| CN | 101147266 A | 3/2008 |
| JP | 05-251710 A | 9/1993 |

OTHER PUBLICATIONS

Ohba, Takuya et al., "A novel tri-control gat surrounding gate transistor (TCG-SGT) nonvolatile memory cell for flash memory", *Solid-State Electronics*, vol. 50, No. 6, Jun. 2006, pp. 924-928.  
Office Action for U.S. Appl. No. 13/898,982 dated Apr. 23, 2015, 5 pages.  
Notice of Allowance for U.S. Appl. No. 13/898,982 dated Jul. 16, 2015, 8 pages.

* cited by examiner

*Primary Examiner* — Tran Tran  
(74) *Attorney, Agent, or Firm* — Brinks Gilson & Lione

(57) ABSTRACT

A nonvolatile semiconductor memory transistor includes an island-shaped semiconductor having a source region, a channel region, and a drain region formed in this order from the silicon substrate side, a floating gate arranged so as to surround the outer periphery of the channel region with a tunnel insulating film interposed between the floating gate and the channel region, a control gate arranged so as to surround the outer periphery of the floating gate with an inter-polysilicon insulating film interposed between the control gate and the floating gate, and a control gate line electrically connected to the control gate and extending in a predetermined direction. The inter-polysilicon insulating film is interposed between the floating gate and the lower and inner side surfaces of the control gate and between the floating gate and the lower surface of the control gate line.

1 Claim, 46 Drawing Sheets

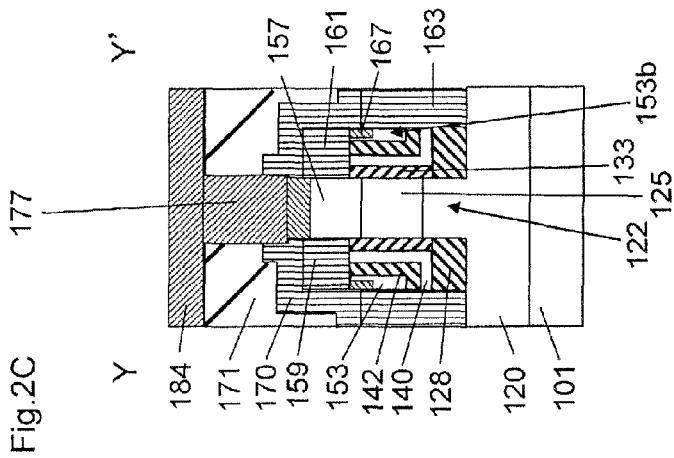
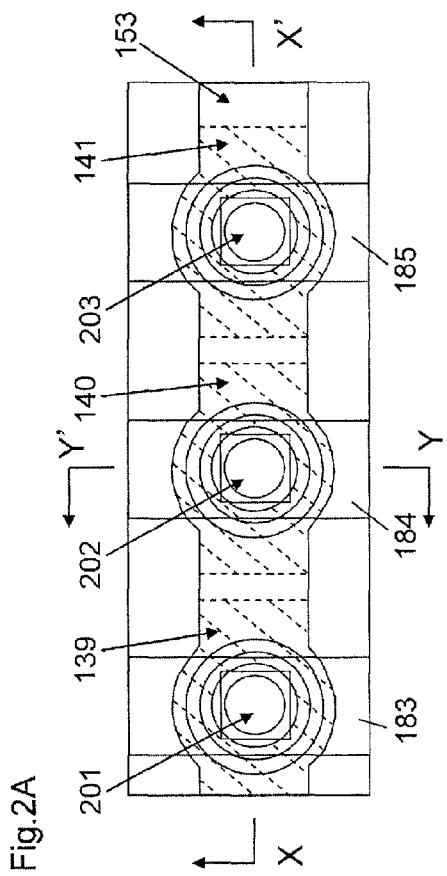
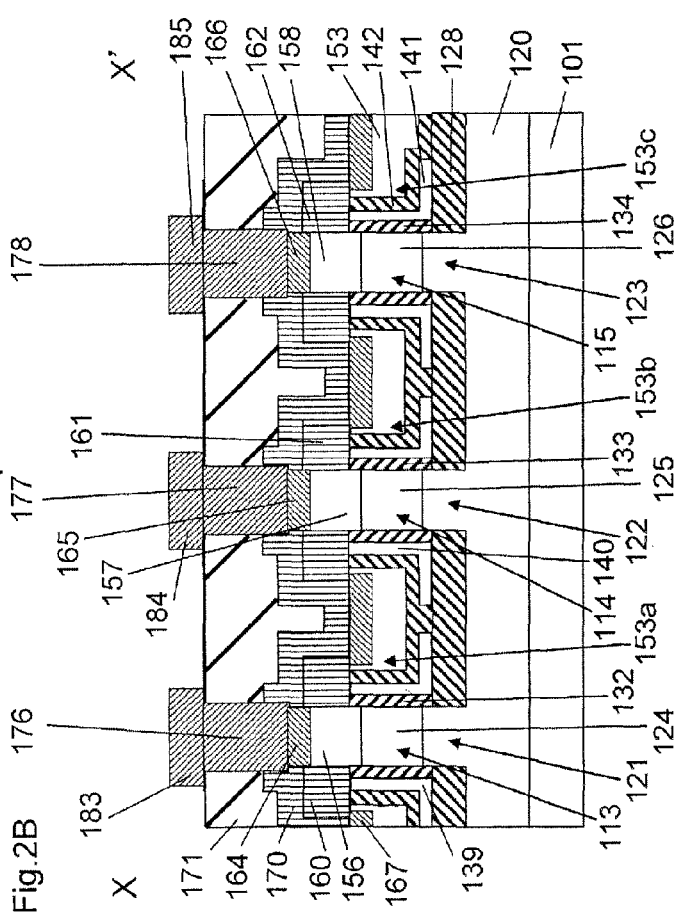
Fig.2A
Fig.2B
Fig.2C

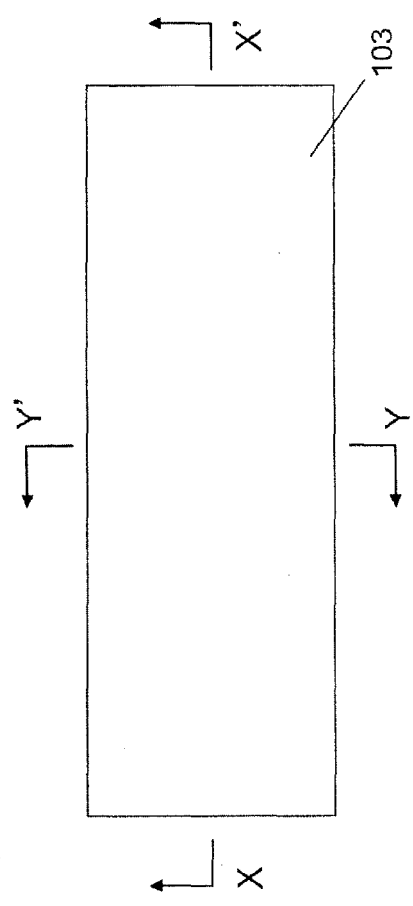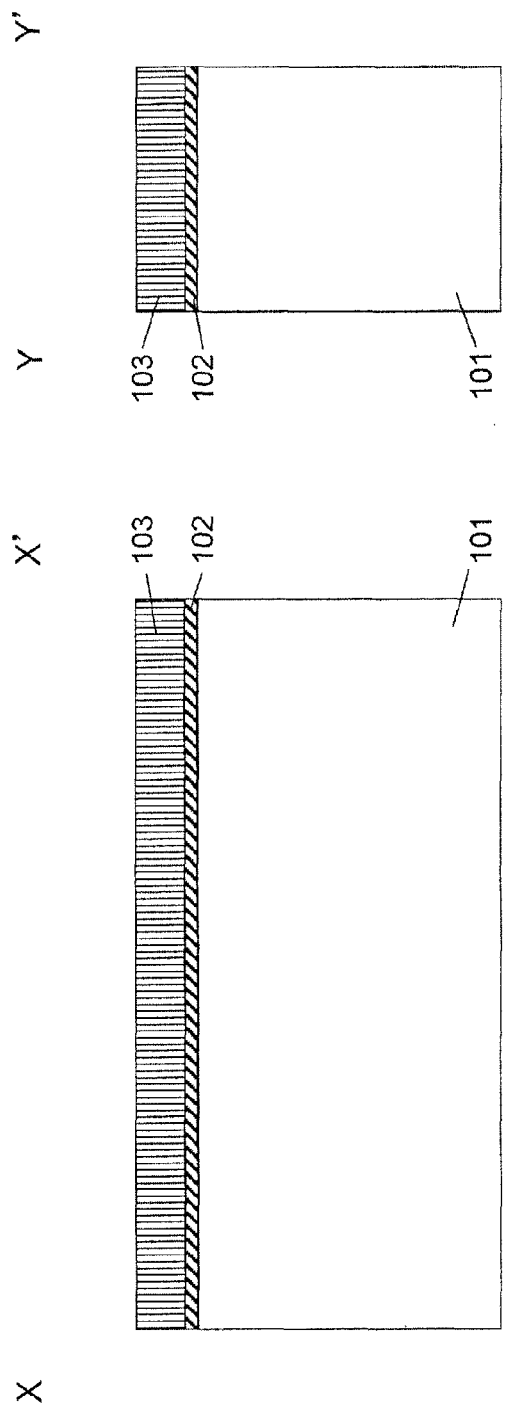

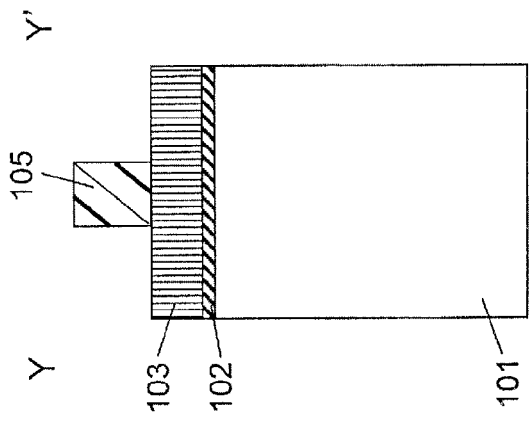
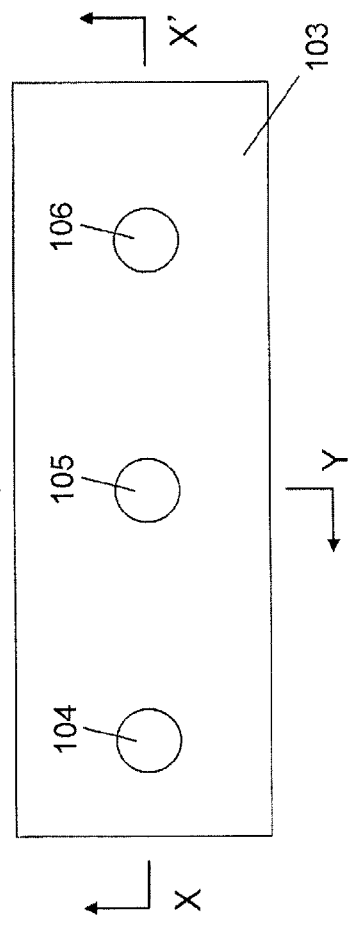
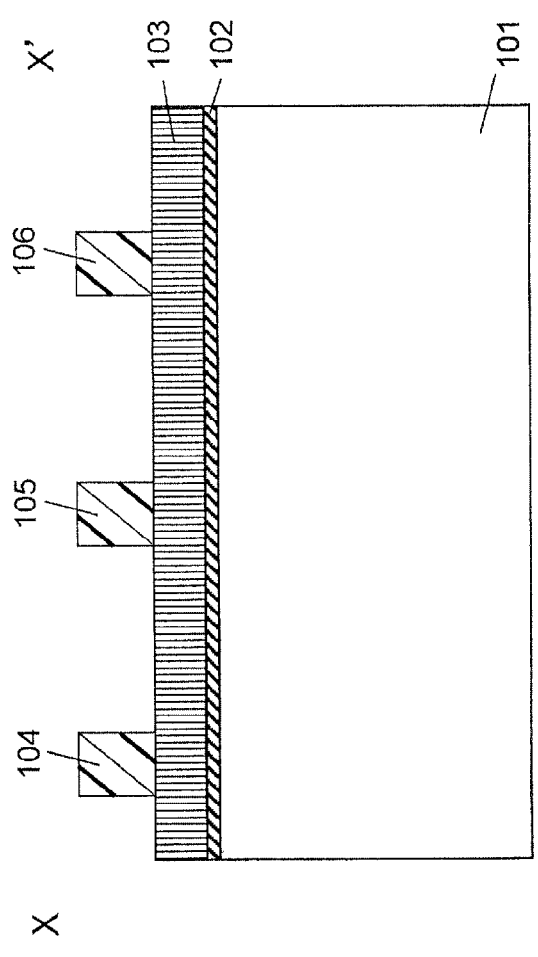

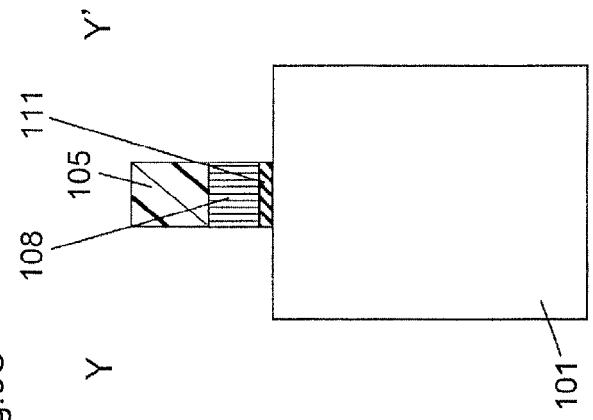
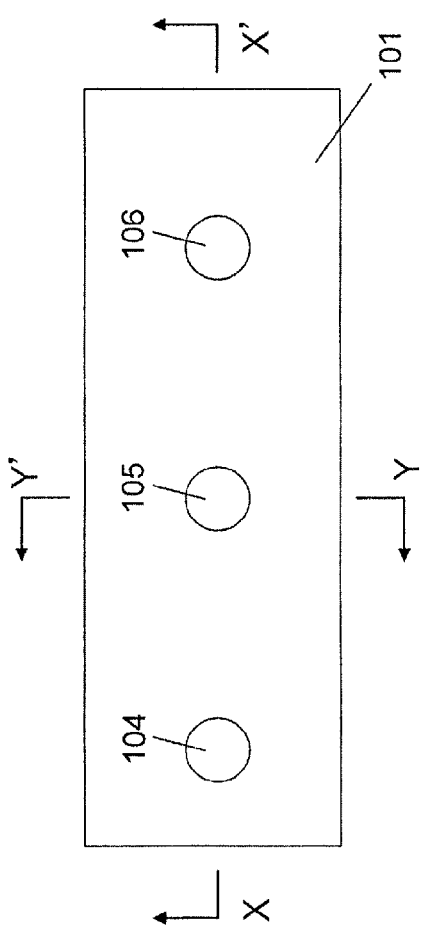
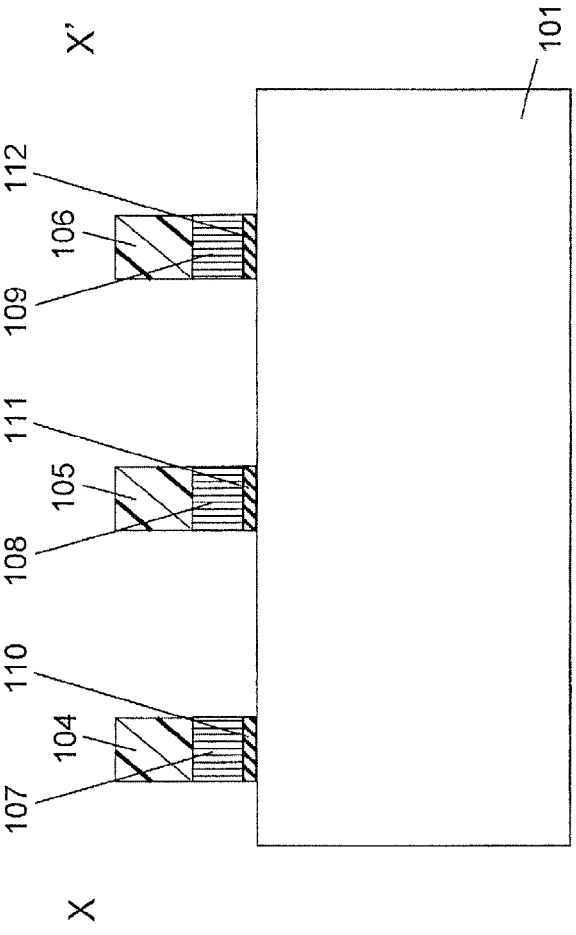

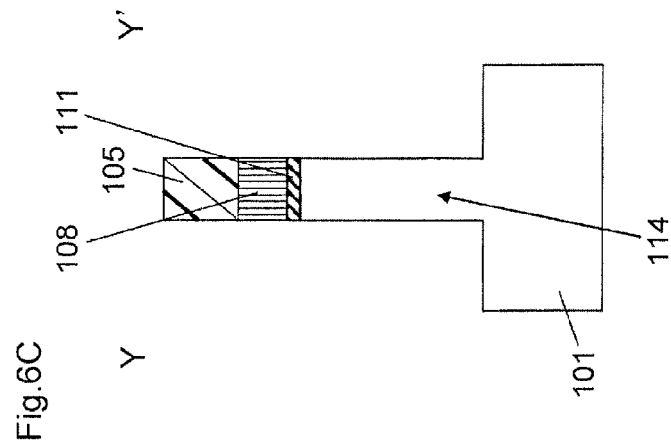
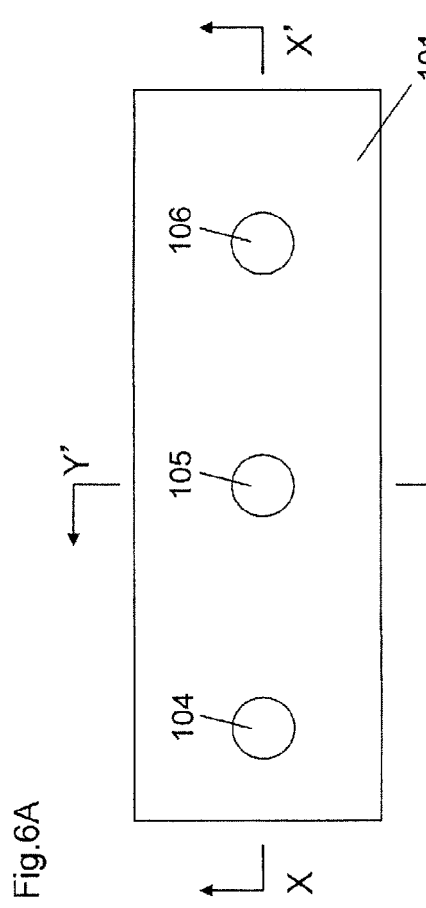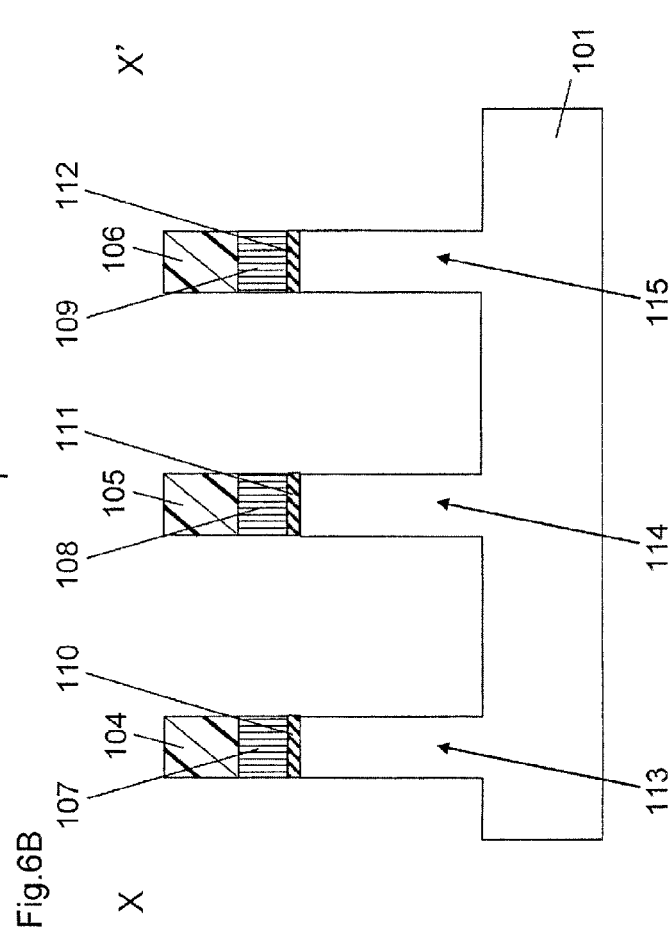

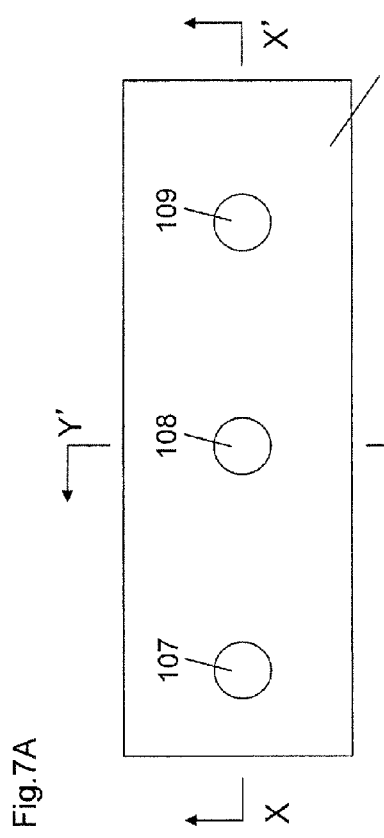
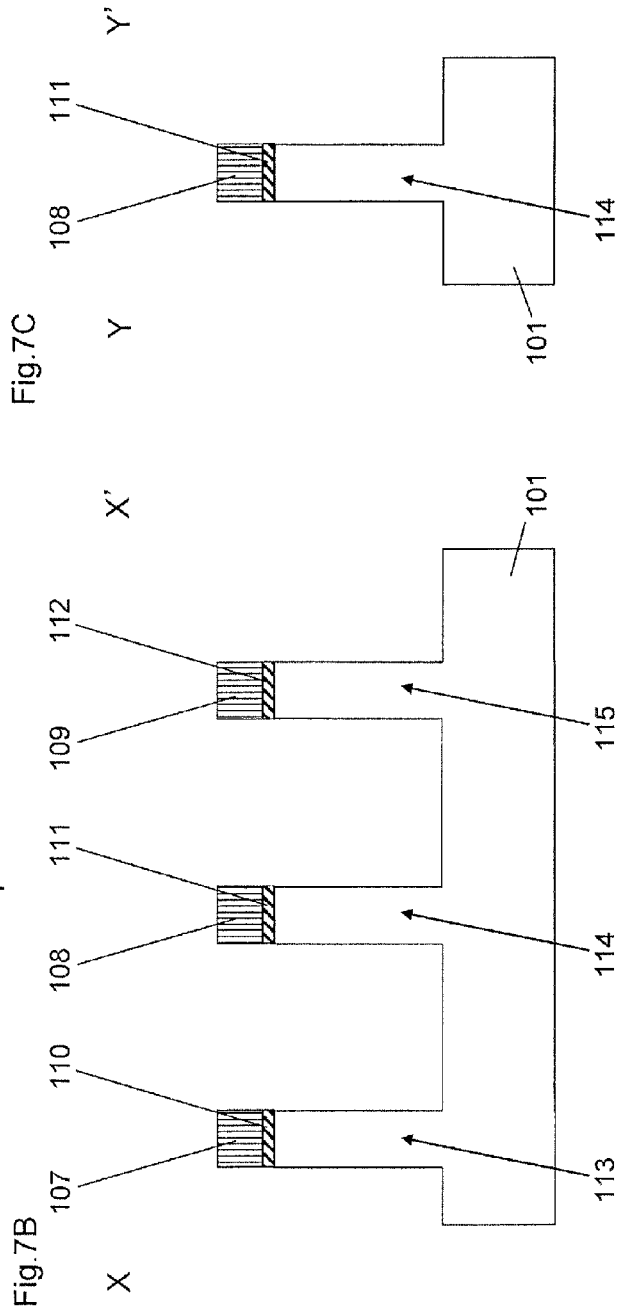

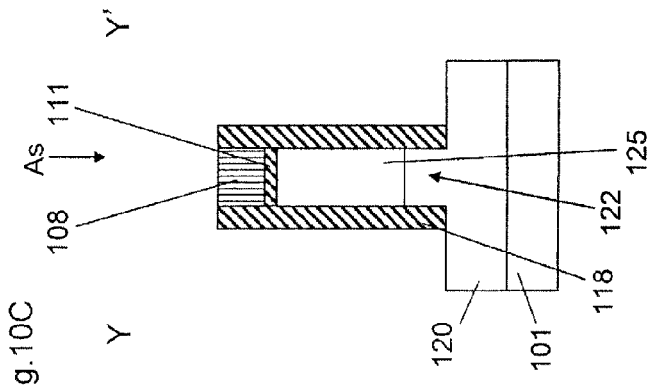
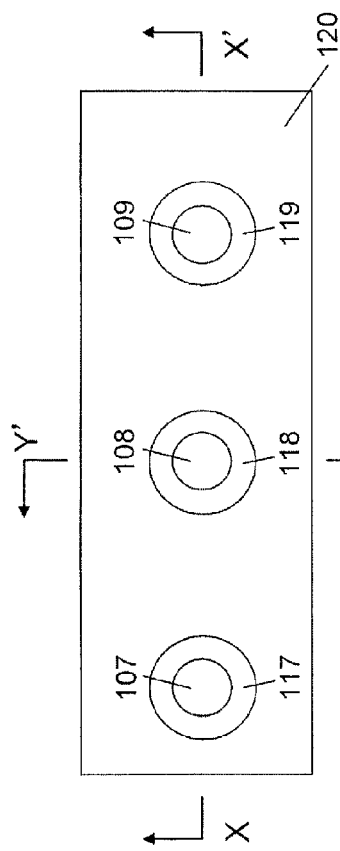
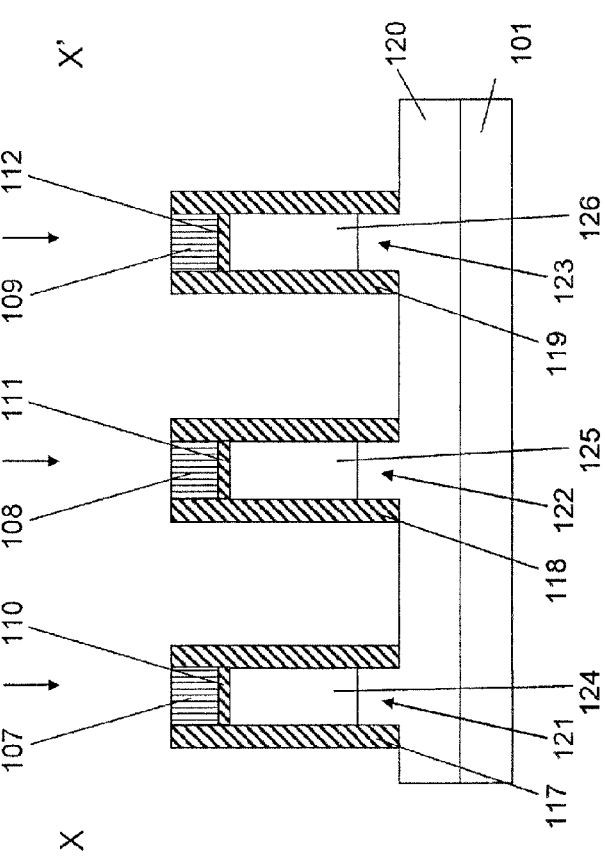
Fig.10A
Fig.10B
Fig.10C

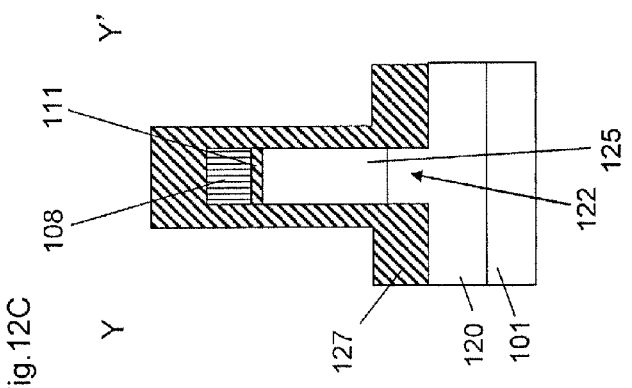
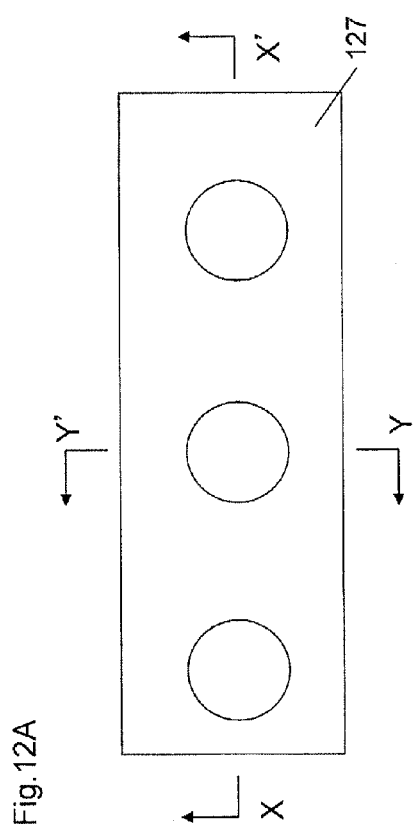
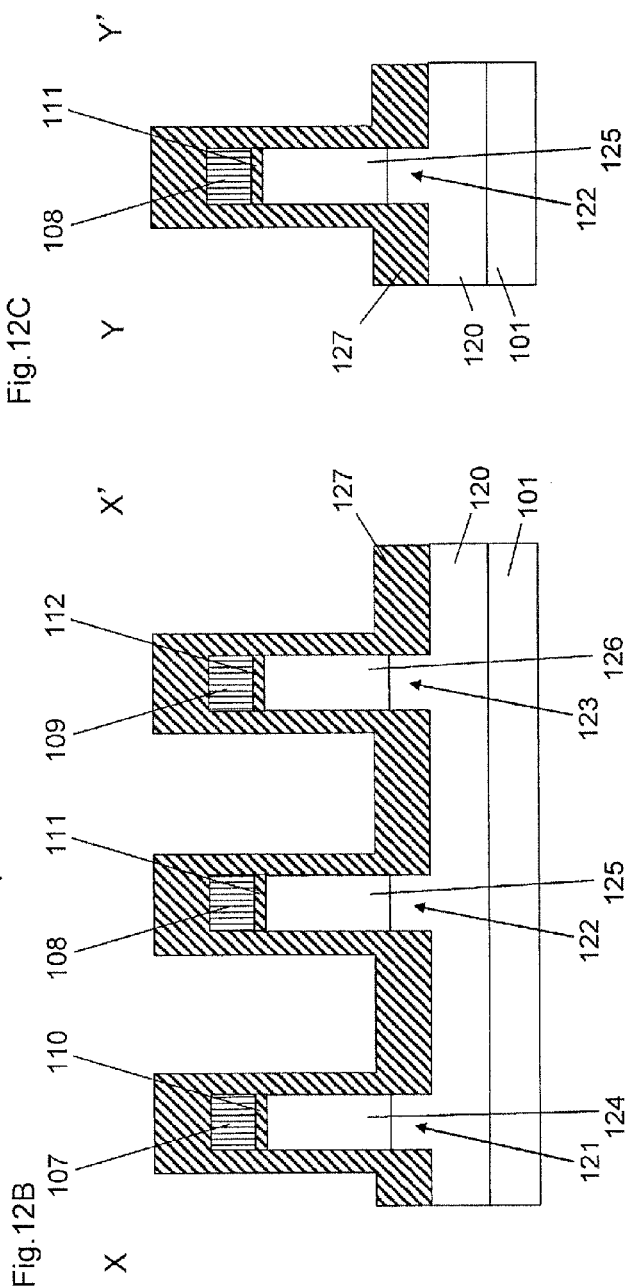

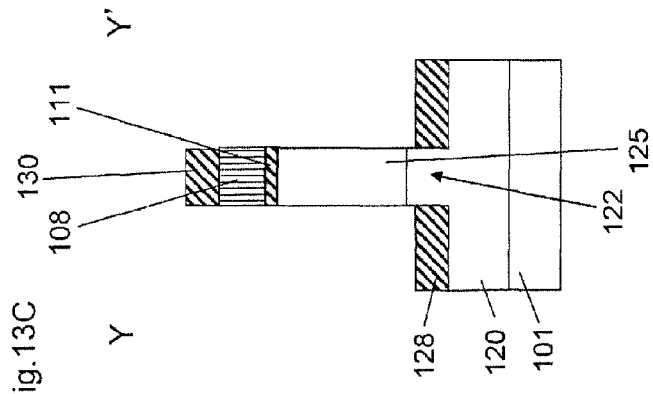
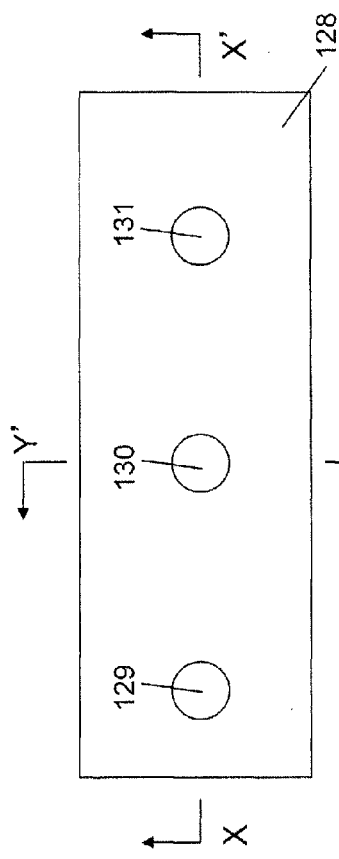
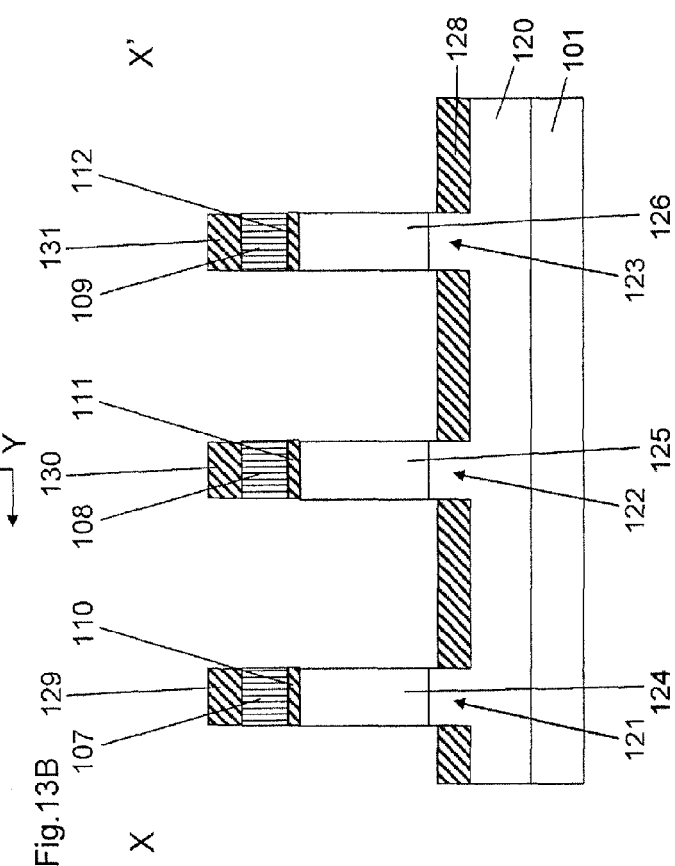

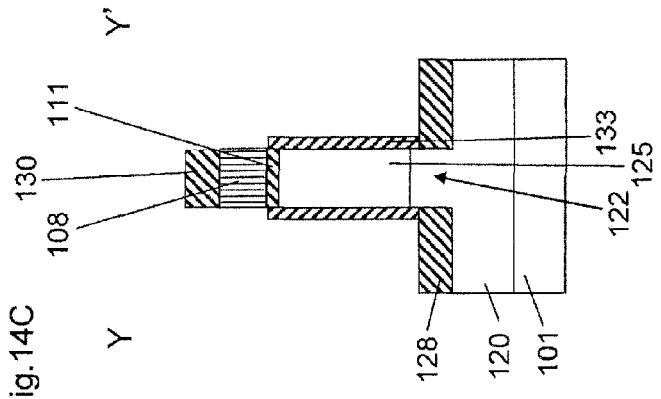
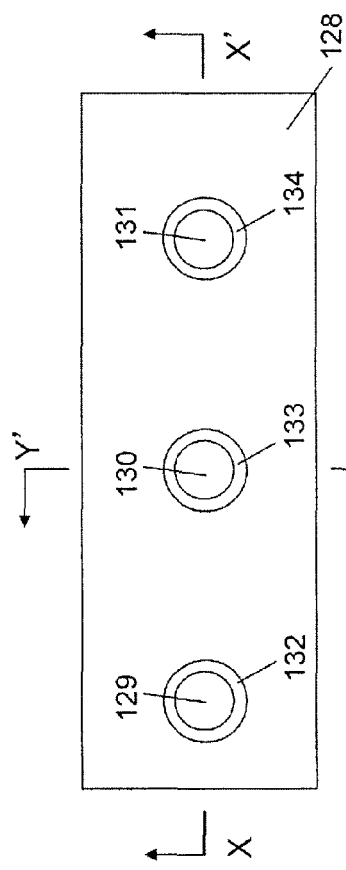
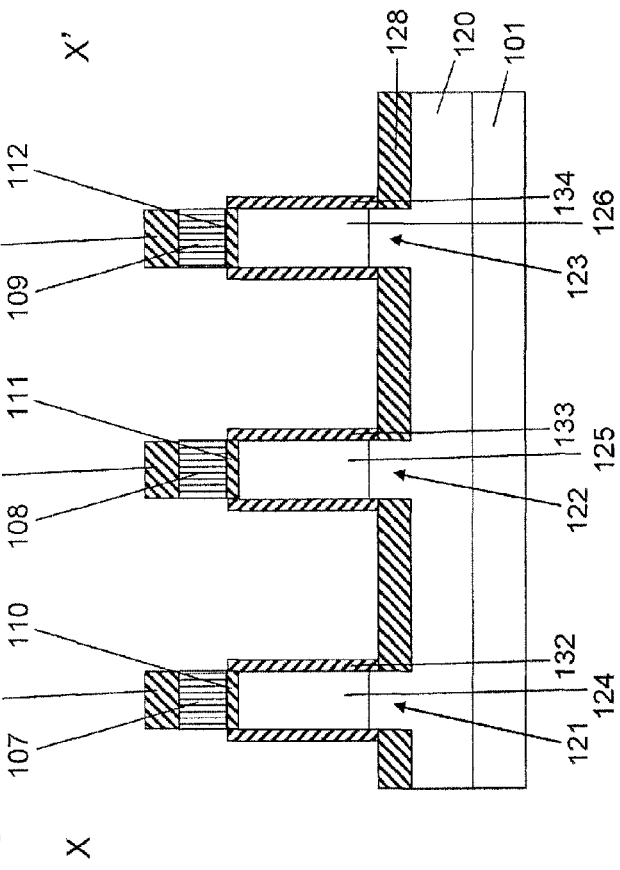

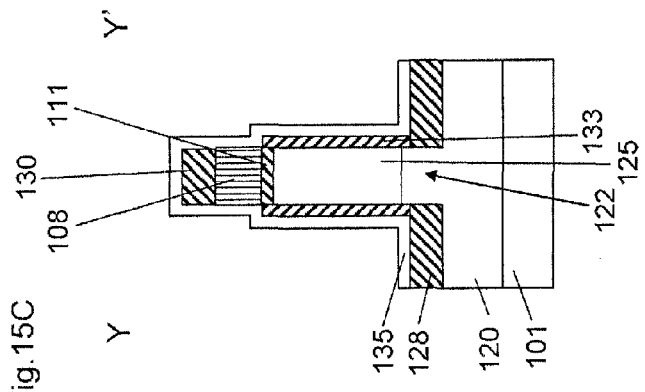
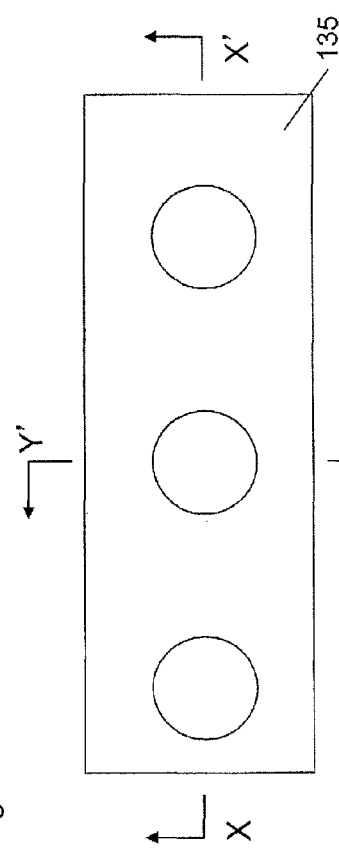
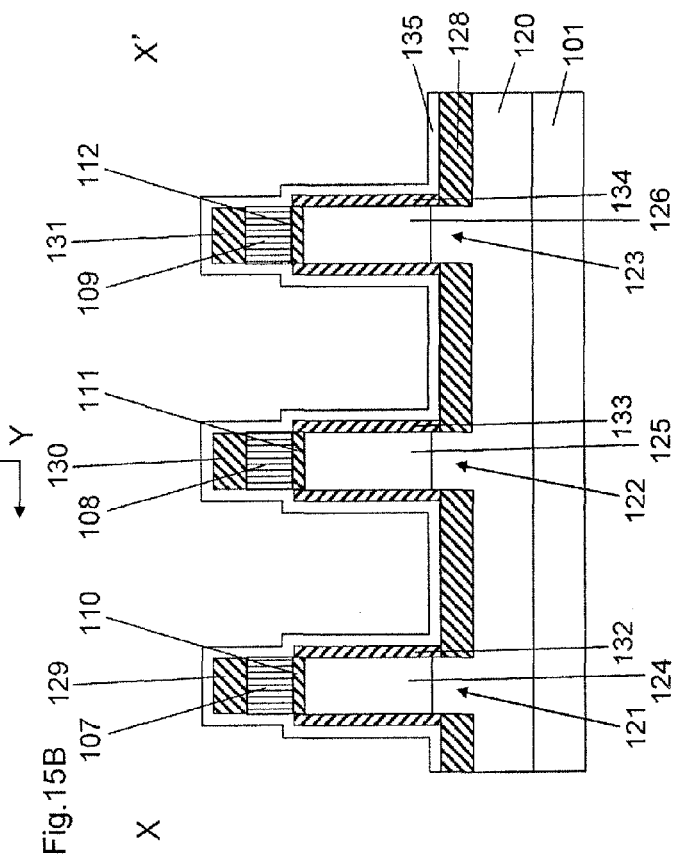

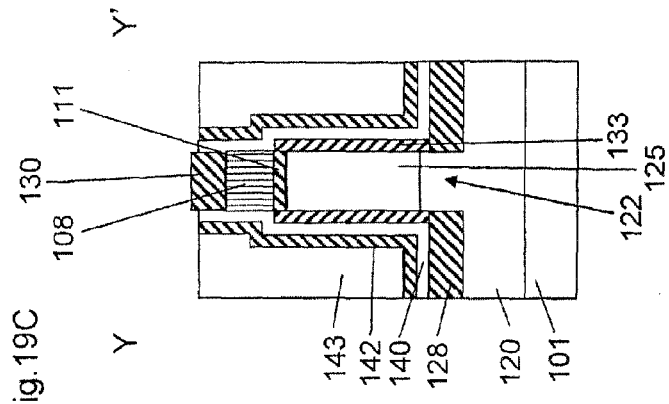
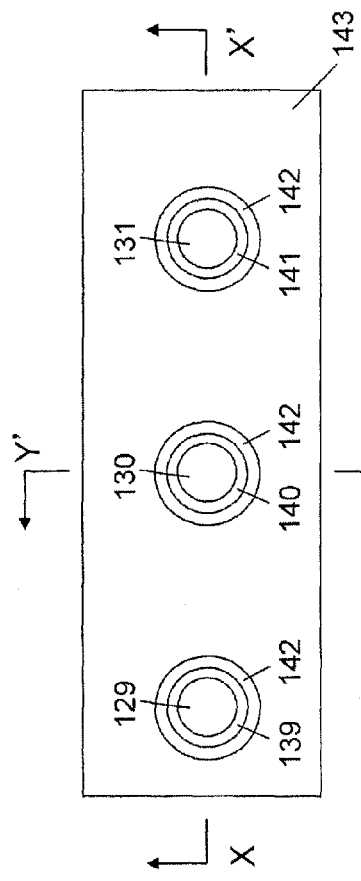
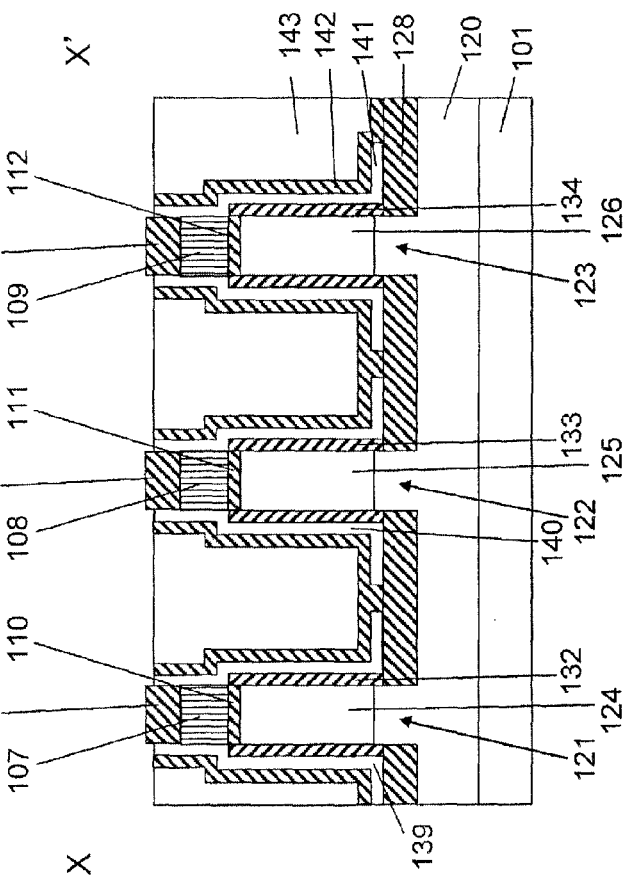

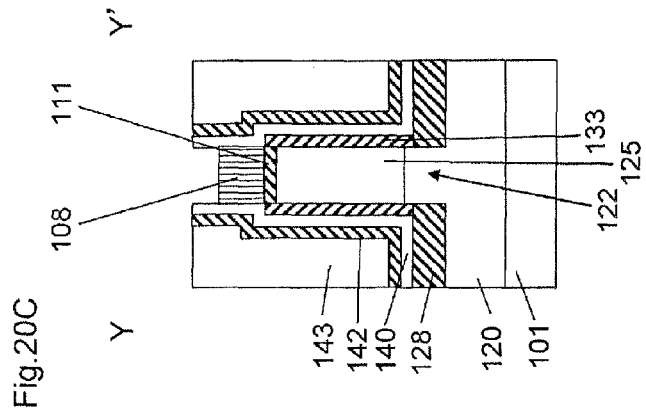
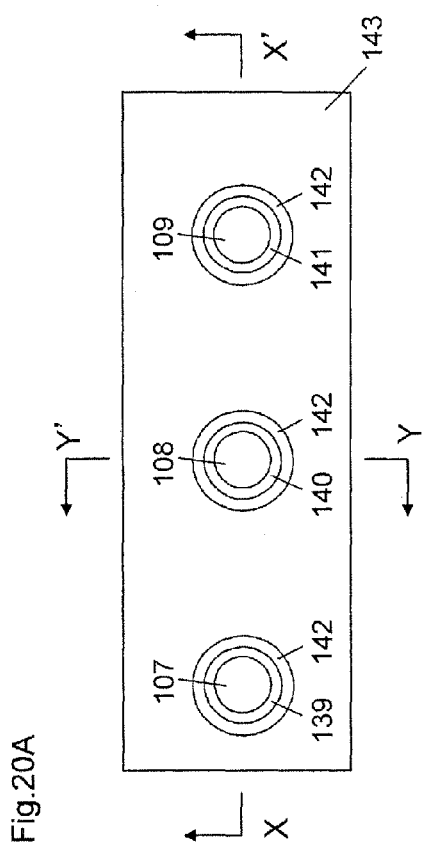
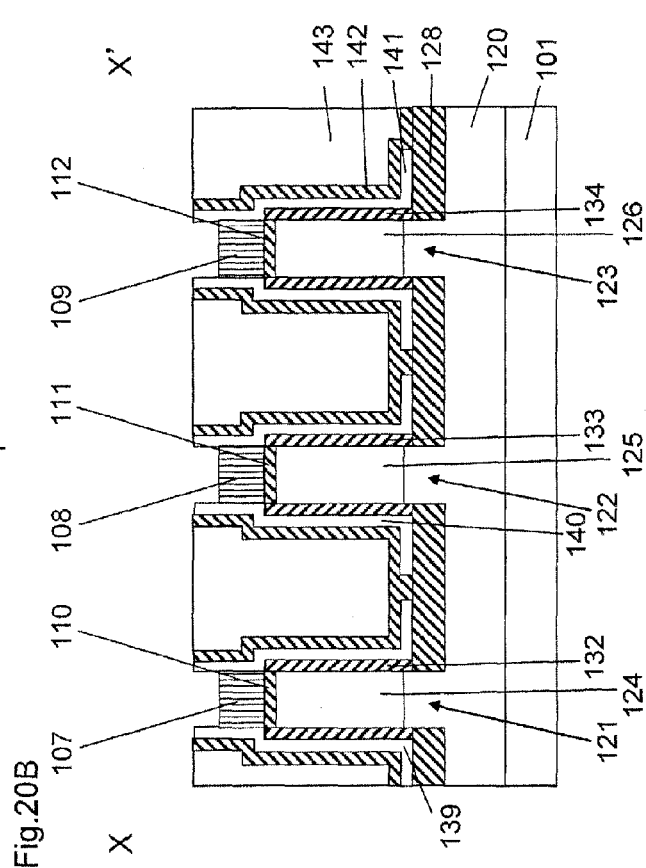

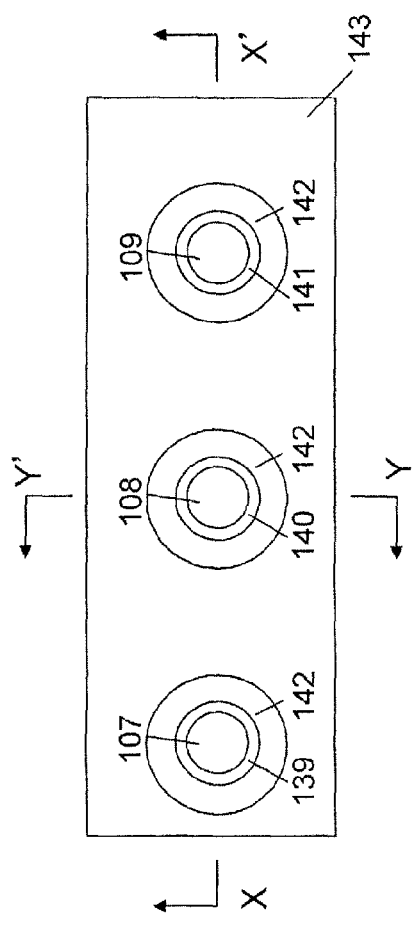
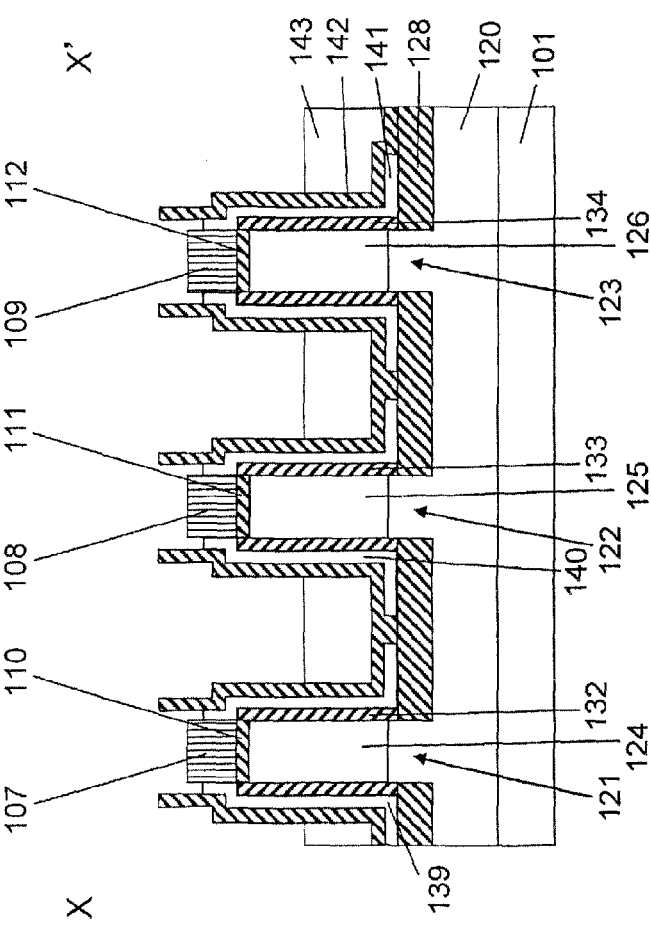
Fig.21A
Fig.21B
Fig.21C

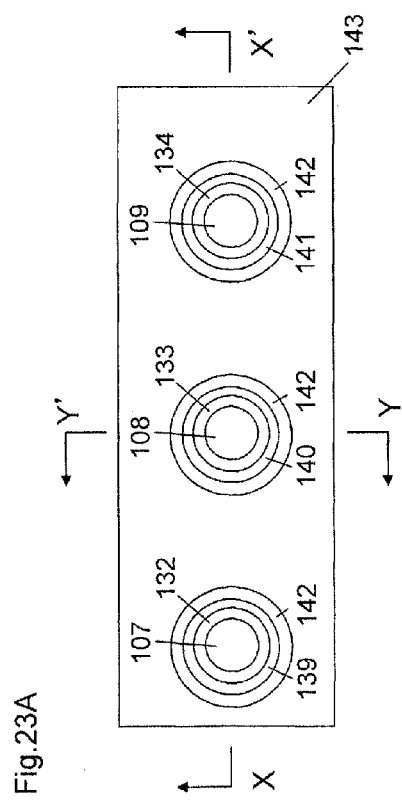
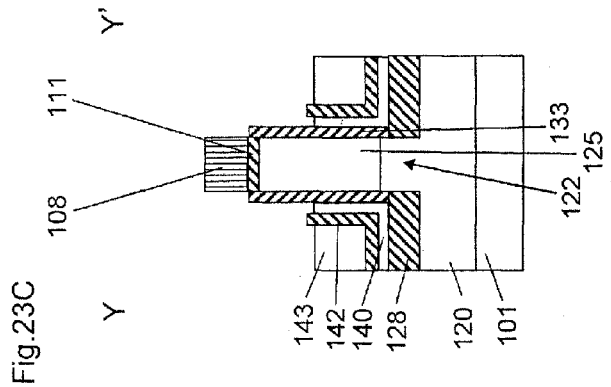
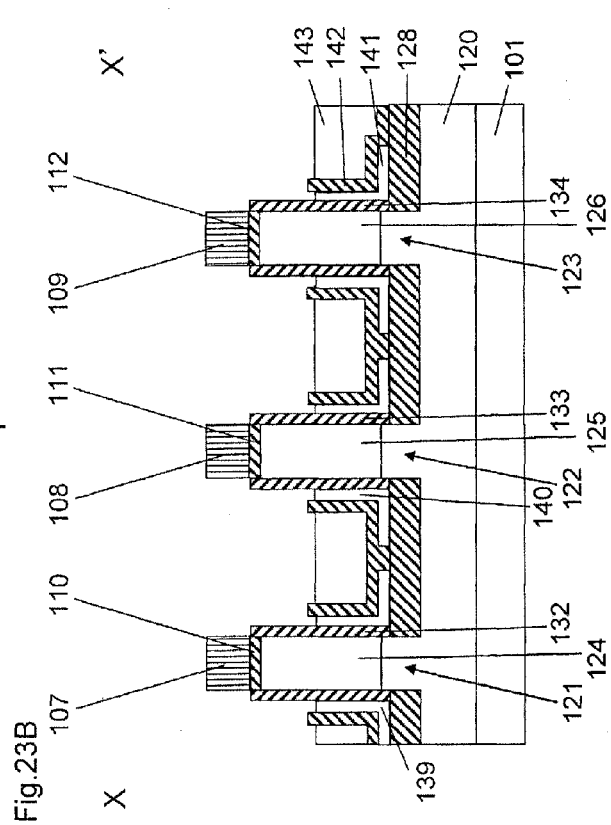

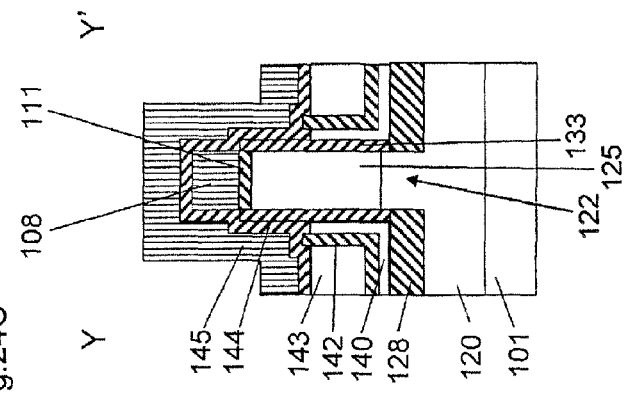
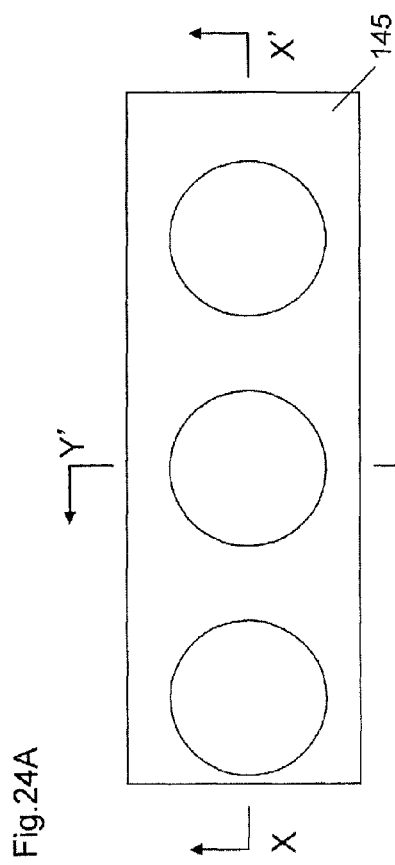
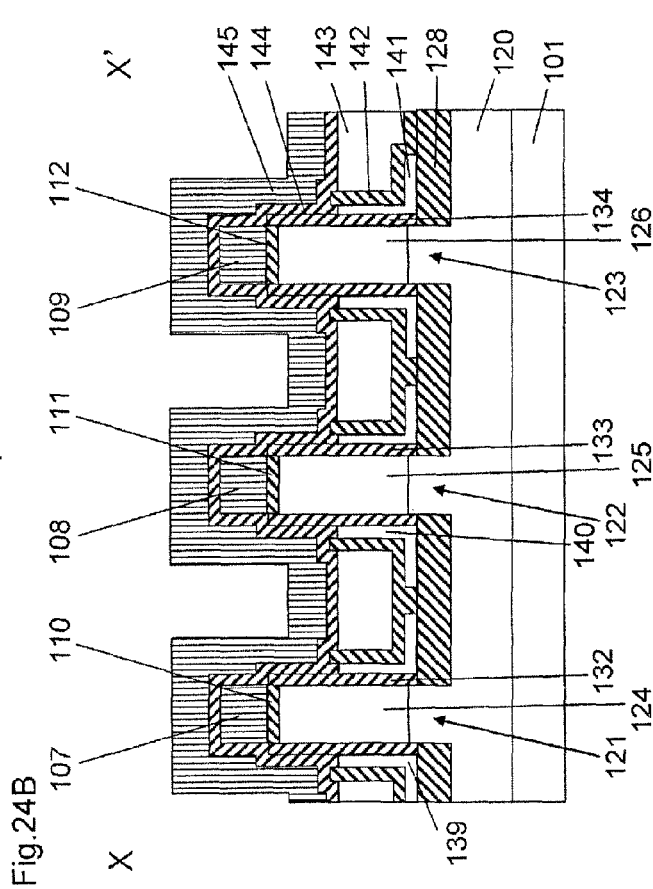

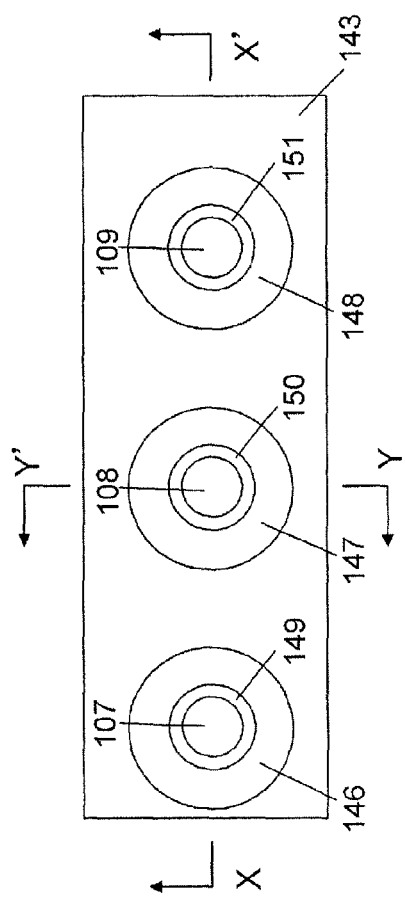
Fig.25A
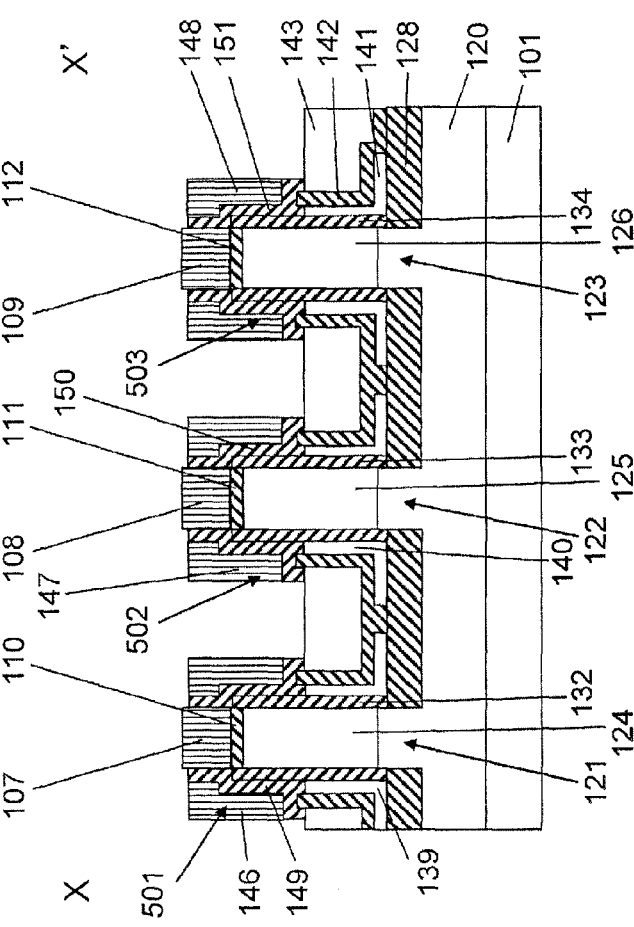
Fig.25B
Fig.25C

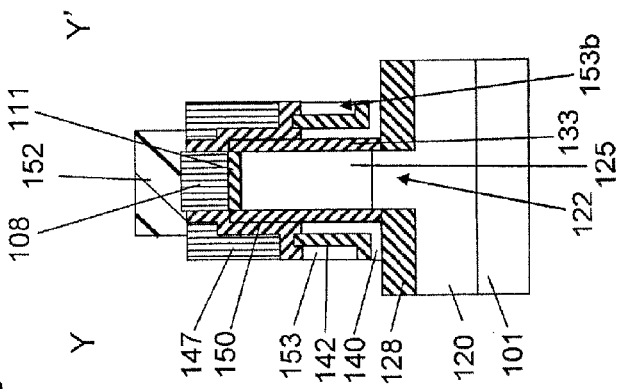
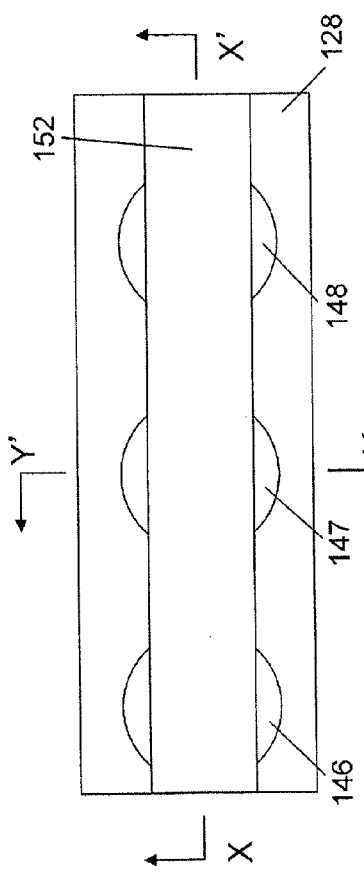
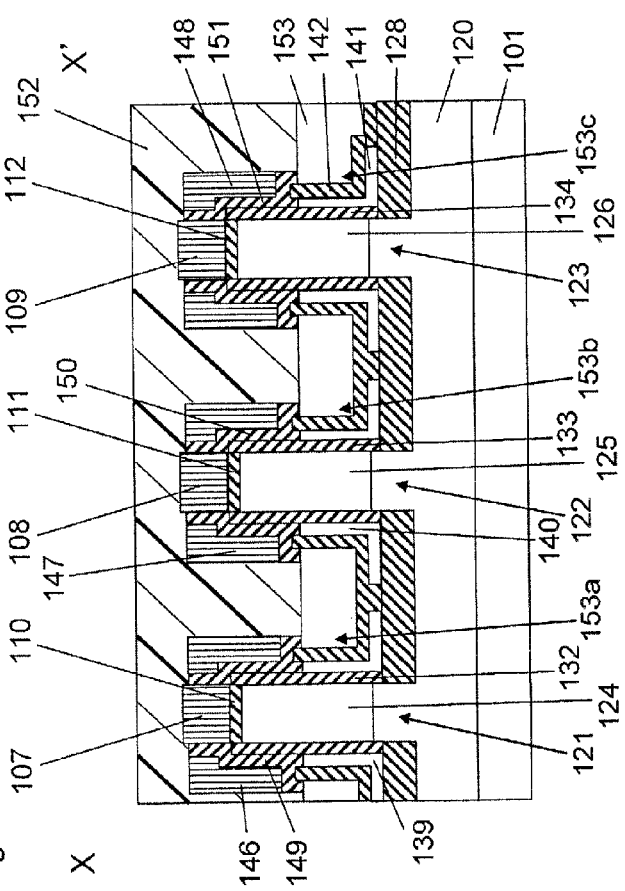

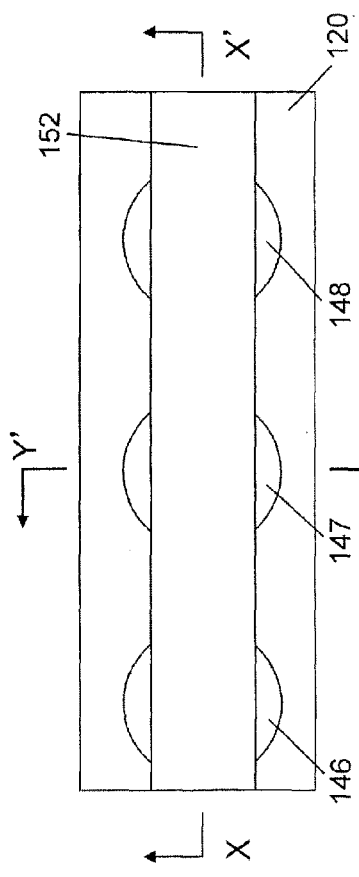
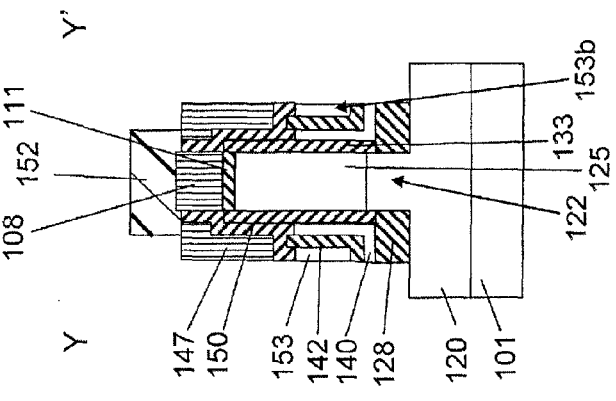
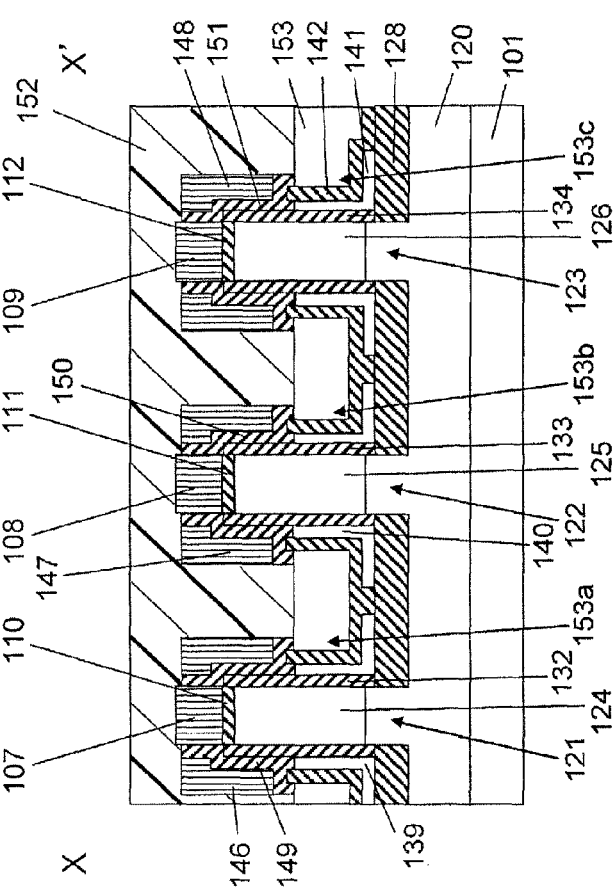

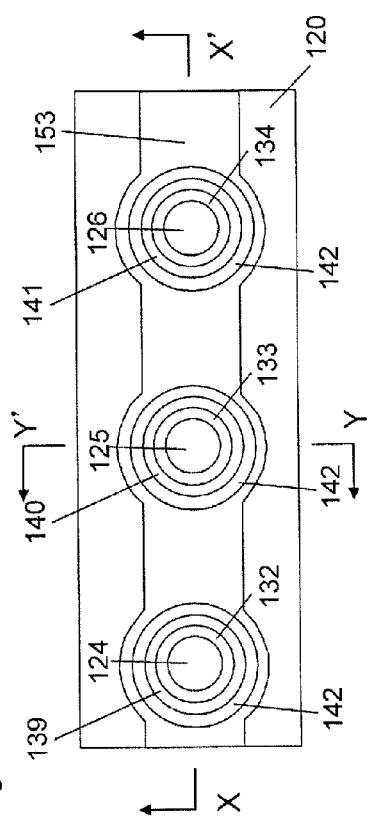
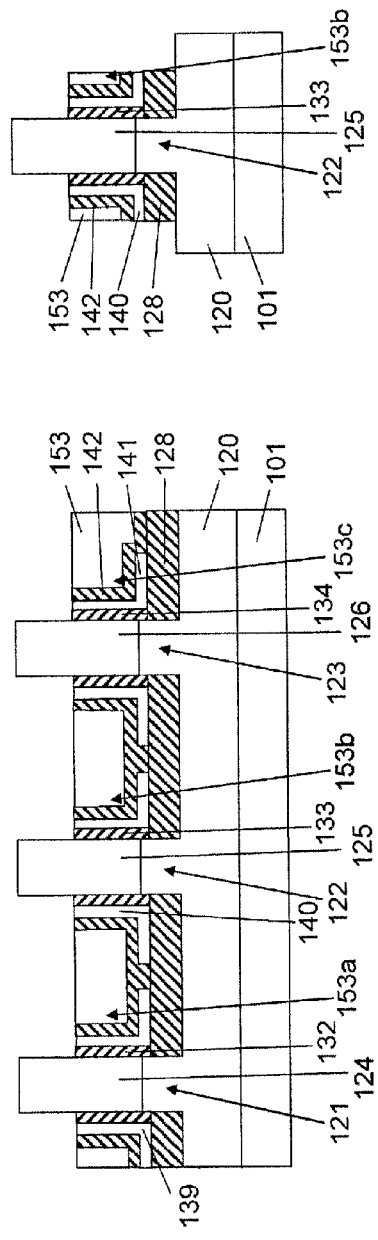
Fig. 31A
Fig. 31B
Fig. 31C

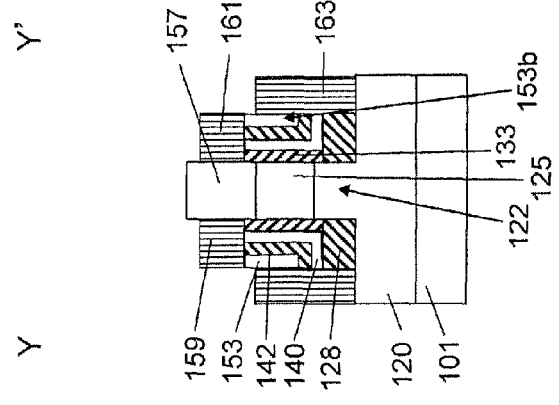
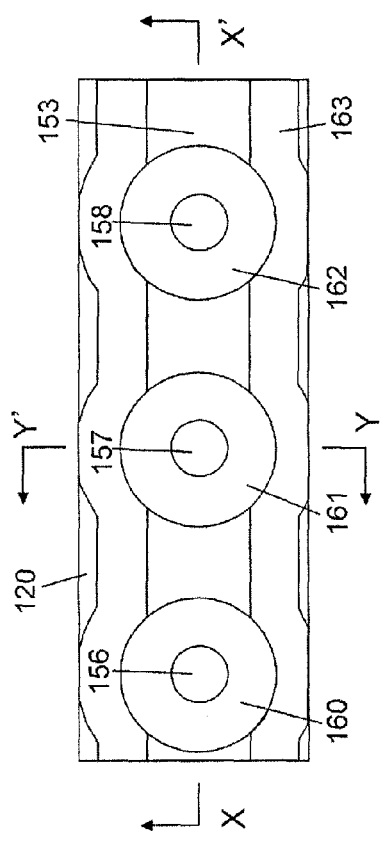
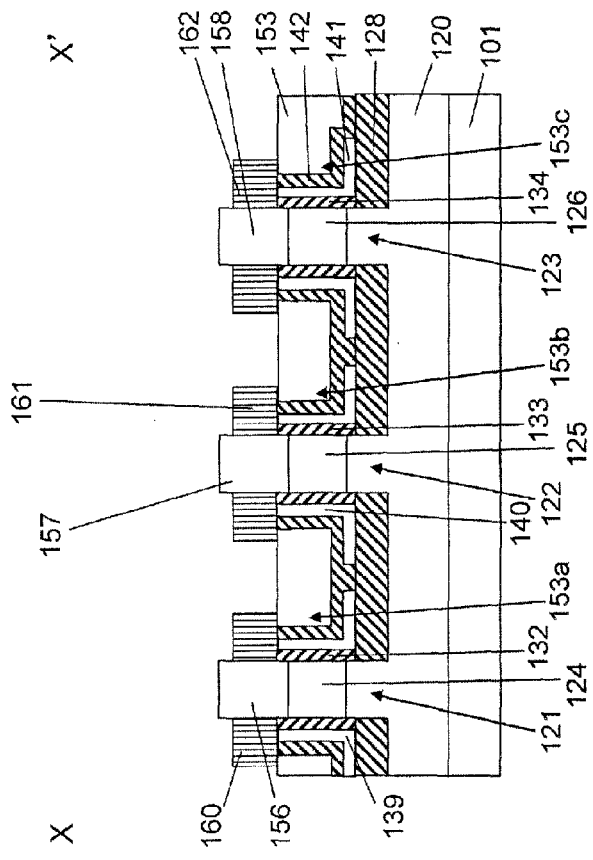

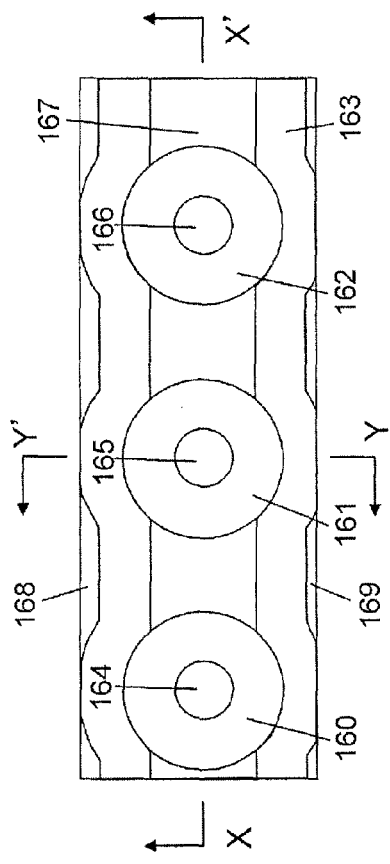
Fig.35A
Fig.35B
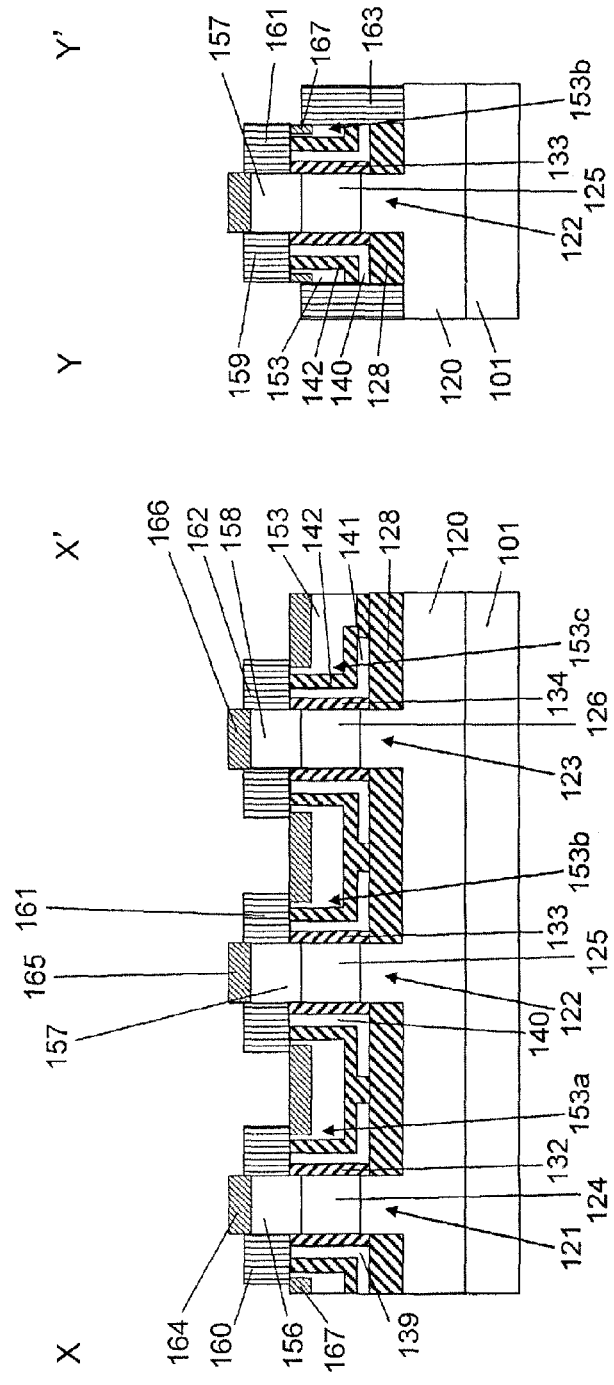
Fig.35C

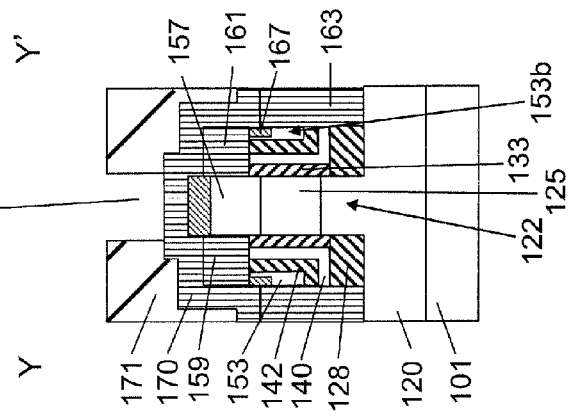
Fig.39A
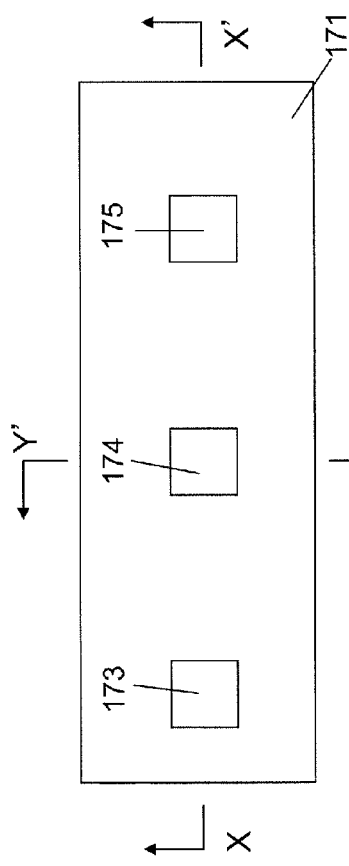
Fig.39B
Fig.39C

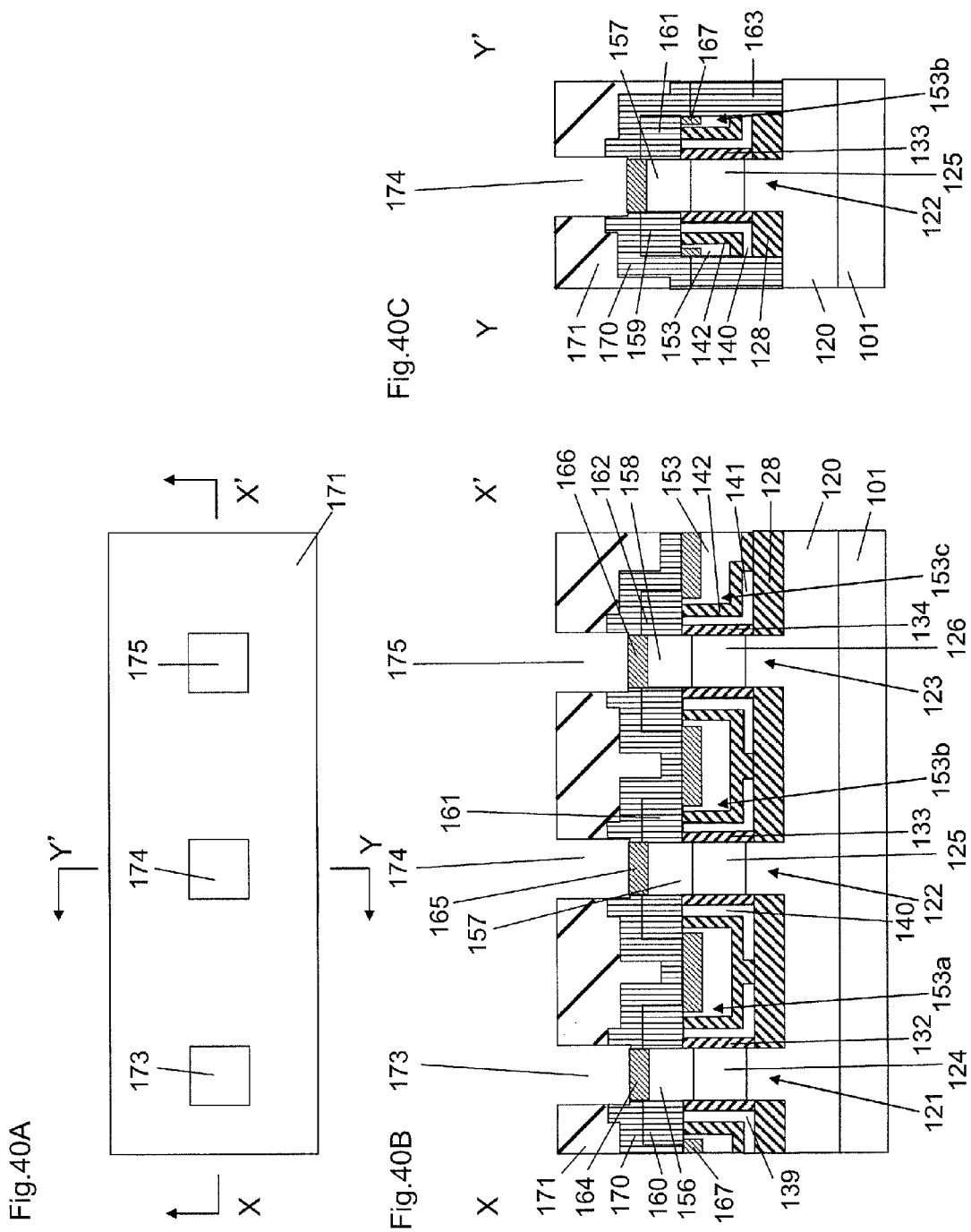

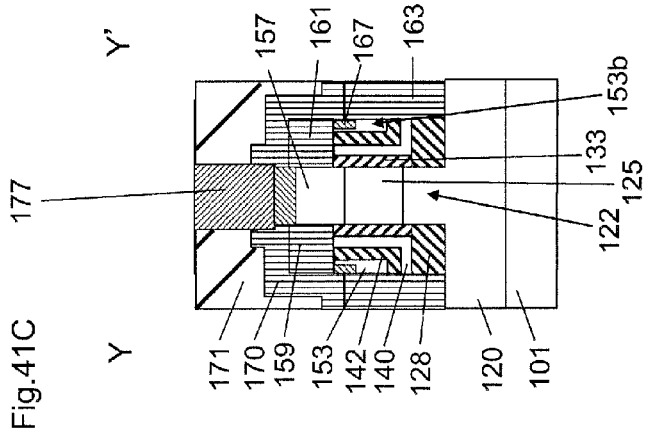
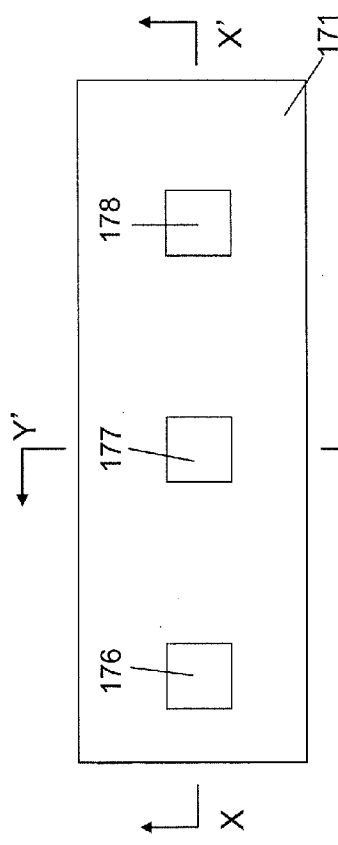
Fig.41A
Fig.41B
Fig.41C

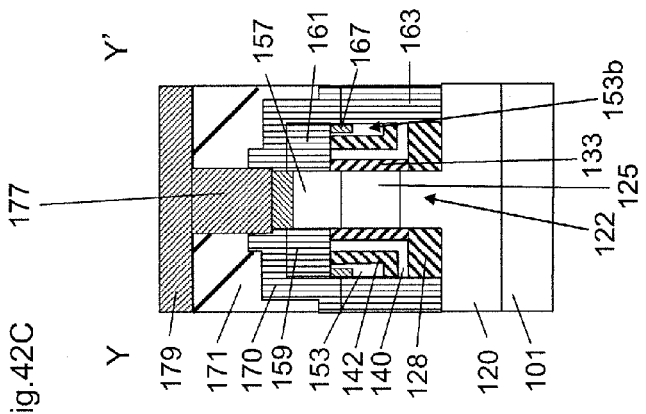
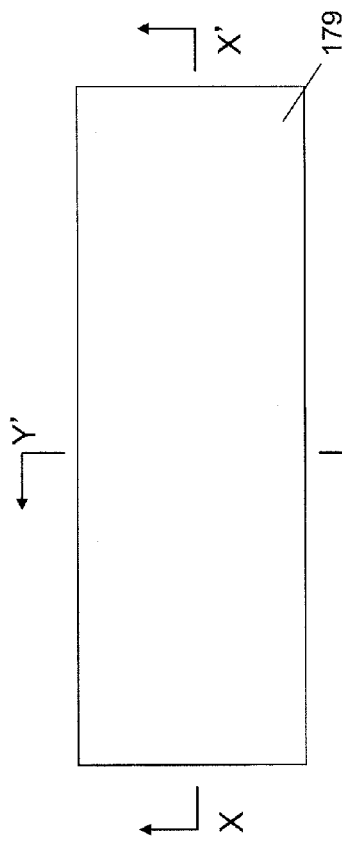
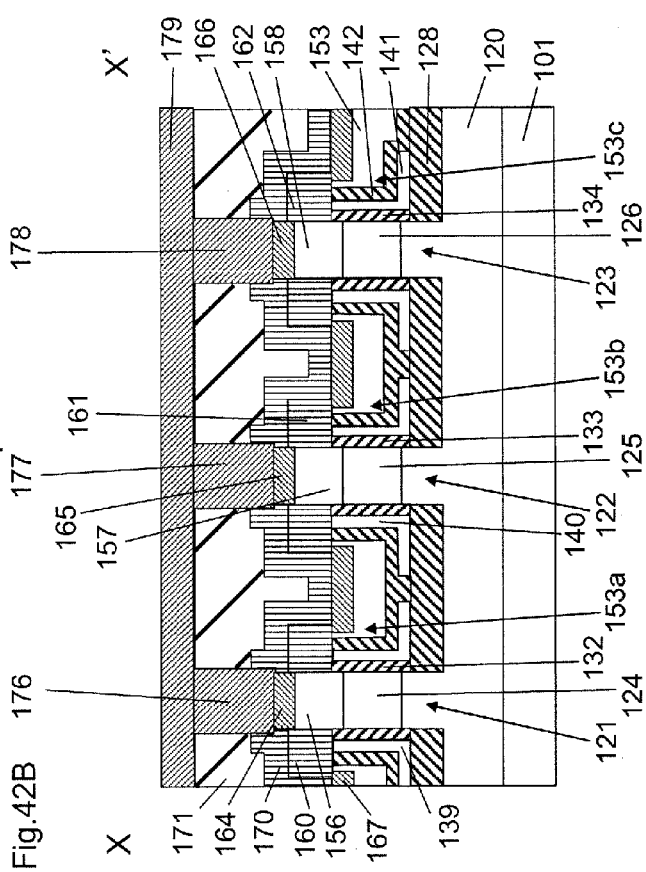

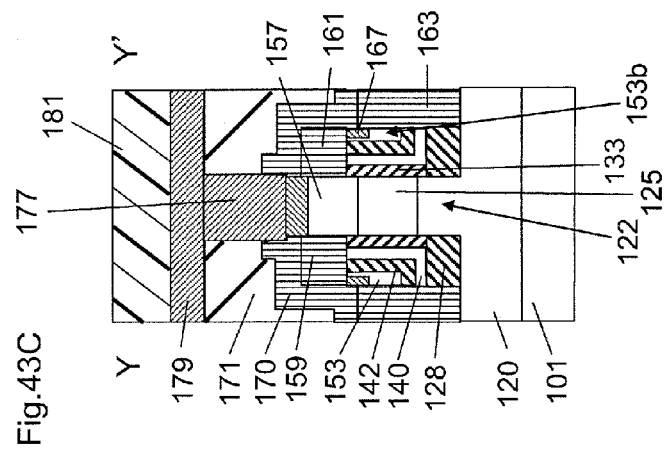
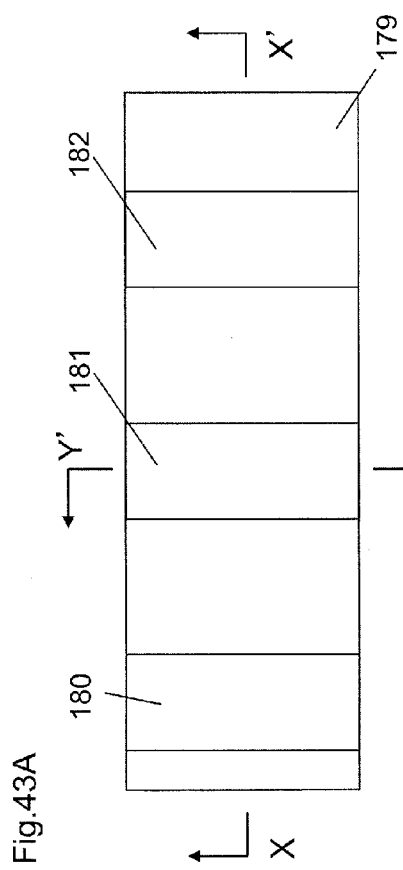
Fig.43A
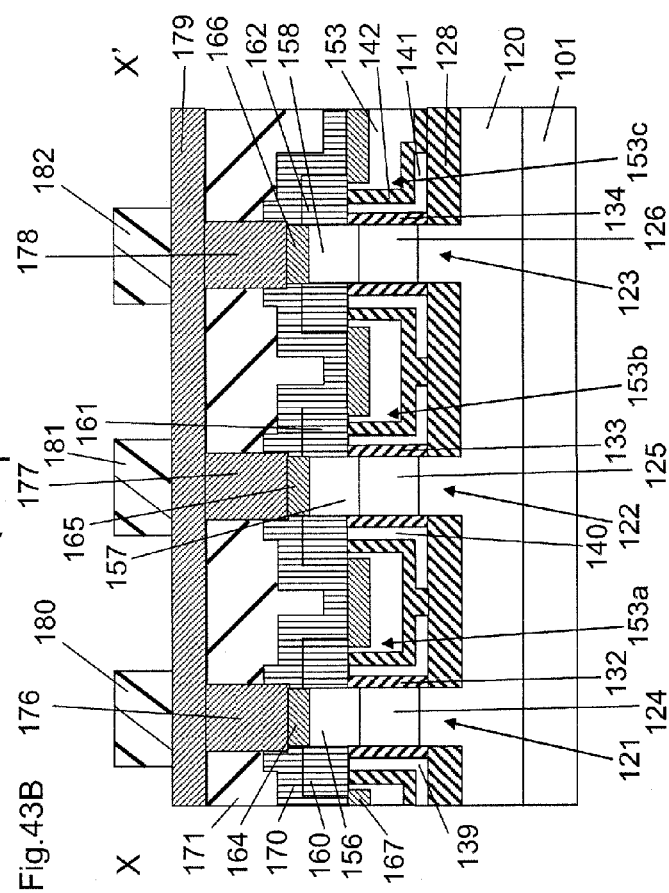
Fig.43B
Fig.43C

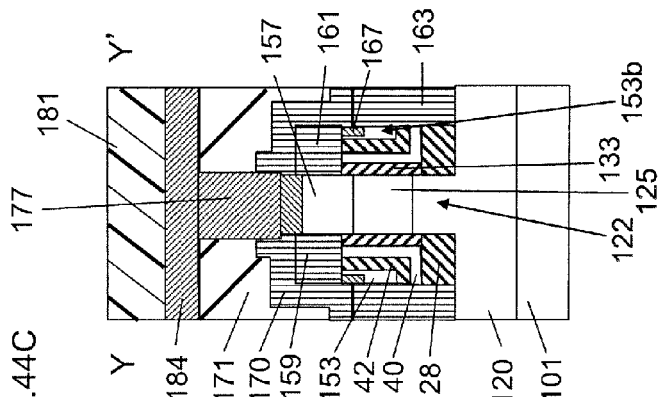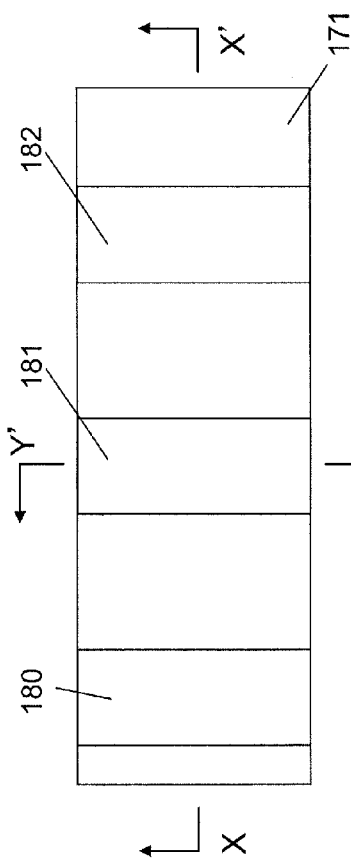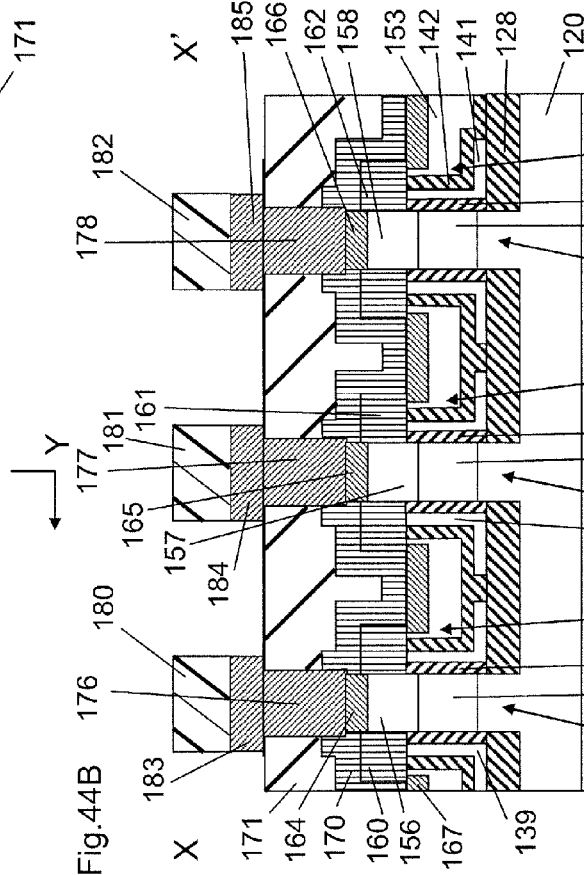

NONVOLATILE SEMICONDUCTOR MEMORY TRANSISTOR AND METHOD FOR MANUFACTURING NONVOLATILE SEMICONDUCTOR MEMORY

RELATED APPLICATIONS

This application is continuation application of U.S. Ser. No. 13/898,982, filed May 21, 2013, now U.S. Pat. No. 8,159,813, which is a divisional patent application of U.S. Ser. No. 13/163,319, filed Jun. 17, 2011, now U.S. Pat. No. 8,471,327, which claims the benefit of the filing date of Provisional U.S. Patent Application Ser. No. 61/367,903 filed on Jul. 27, 2010. This application also claims priority under 35 U.S.C. §119(a) to JP2010-168148 filed on Jul. 27, 2010. The entire contents of these applications are hereby incorporated by reference.

BACKGROUND

1. Field of the Invention

The present invention relates to a nonvolatile semiconductor memory transistor and a method for manufacturing a nonvolatile semiconductor memory.

2. Description of the Related Art

A flash memory including a control gate and a charge storage layer and designed to inject electric charge into the charge storage layer using hot electron injection, using Fowler-Nordheim current, or the like is known. Memory cells of the flash memory record unit data "1" or "0" using the difference in threshold voltage, which depends on the charge storage state of the charge storage layer.

In order to efficiently perform injection of electrons into the charge storage layer and emission of electrons from the charge storage layer, that is, writing and erasing of unit data, the capacitive coupling relationship between a floating gate and a control gate is important. The greater the capacitance between the floating gate and the control gate is, the more effectively the potential of the control gate can be transmitted to the floating gate. Therefore, writing and erasing are facilitated.

In order to increase the capacitance between the floating gate and the control gate, a Tri-Control Gate Surrounding Gate Transistor (TCG-SGT) Flash Memory Cell illustrated in FIG. 46 has been proposed (for example, see Takuya Ohba, Hiroki Nakamura, Hiroshi Sakuraba, Fujio Masuoka, "A novel tri-control gate surrounding gate transistor (TCG-SGT) nonvolatile memory cell for flash memory", Solid-State Electronics, Vol. 50, No. 6, pp. 924-928, June 2006). Since the control gate of the TCG-SGT flash memory cell has a structure that covers, in addition to the side surface of the floating gate, the upper and lower surfaces of the floating gate, the capacitance between the floating gate and the control gate can be increased, and writing and erasing are facilitated.

However, in order to increase the capacitance between the floating gate and the control gate in the TCG-SGT flash memory cell illustrated in FIG. 46, it is necessary to increase the thickness of the floating gate. If the film thickness of the floating gate is small, it is difficult to increase the capacitance between the floating gate and the control gate.

SUMMARY

Accordingly, the present invention provides a nonvolatile semiconductor memory transistor having a structure utilizing an island-shaped semiconductor, in which the capacitance between a floating gate and a control gate can be increased, and a method for manufacturing a nonvolatile semiconductor memory.

A first aspect of the present invention provides a nonvolatile semiconductor memory transistor including an island-shaped semiconductor, a floating gate, a control gate, and a control gate line. The island-shaped semiconductor has a source region, a channel region, and a drain region formed in the order of the source region, the channel region, and the drain region from the side of a substrate. The floating gate is arranged so as to surround an outer periphery of the channel region in such a manner that a tunnel insulating film is interposed between the floating gate and the channel region. The control gate is arranged so as to surround an outer periphery of the floating gate in such a manner that an inter-polysilicon insulating film is interposed between the control gate and the floating gate. The control gate line is electrically connected to the control gate and extending in a predetermined direction. The inter-polysilicon insulating film is arranged so as to be interposed between the floating gate and a lower surface and an inner side surface of the control gate and between the floating gate and a lower surface of the control gate line.

Preferably, the nonvolatile semiconductor memory transistor further includes a first insulating film arranged on the substrate so as to be located below the floating gate, the first insulating film being thicker than at least one of the tunnel insulating film and the inter-polysilicon insulating film.

A second aspect of the present invention provides a method for manufacturing a nonvolatile semiconductor memory including a floating gate arranged so as to surround an outer periphery of an island-shaped semiconductor with a tunnel insulating film interposed between the floating gate and the island-shaped semiconductor, a control gate arranged so as to surround an outer periphery of the floating gate with an inter-polysilicon insulating film interposed between the control gate and the floating gate, and a control gate line electrically connected to the control gate and extending in a predetermined direction. The method includes a step of forming a plurality of island-shaped semiconductors on a source line formed at a predetermined position on a substrate; a step of forming an insulating film between the island-shaped semiconductors that are adjacent to each other and on the source line; a step of forming a floating gate film by depositing a conductive material on the insulating film; a step of forming a resist on the floating gate film, the resist having a groove extending in a direction perpendicular to the predetermined direction in which the control gate line extends; a step of forming a floating gate for each of the island-shaped semiconductors using the resist by separating the floating gate film from a portion that is a lower region of the groove and that is on the insulating film by etching; a step of forming a control gate for each of the island-shaped semiconductors, above two floating gates of adjacent island-shaped semiconductors among the island-shaped semiconductors, so as to surround the outer periphery of the island-shaped semiconductor; and a step of forming the control gate line to connect the control gates of adjacent island-shaped semiconductors among the island-shaped semiconductors.

According to the present invention, it is possible to provide a nonvolatile semiconductor memory transistor having a structure utilizing an island-shaped semiconductor, in which the capacitance between a floating gate and a control gate can be increased, and a method for manufacturing a nonvolatile semiconductor memory.

BRIEF DESCRIPTION OF THE DRAWING

FIG. 2A is a plan view of a nonvolatile semiconductor memory according to an embodiment of the present invention, FIG. 2B is a cross-sectional view taken along line X-X' of FIG. 2A, and FIG. 2C is a cross-sectional view taken along line Y-Y' of FIG. 2A.

FIG. 3A is a plan view illustrating a method for manufacturing a nonvolatile semiconductor memory according to an embodiment of the present invention, FIG. 3B is a cross-sectional view taken along line X-X' of FIG. 3A, and FIG. 3C is a cross-sectional view taken along line Y-Y' of FIG. 3A.

FIG. 4A is a plan view illustrating the method for manufacturing a nonvolatile semiconductor memory according to the embodiment of the present invention, FIG. 4B is a cross-sectional view taken along line X-X' of FIG. 4A, and FIG. 4C is a cross-sectional view taken along line Y-Y' of FIG. 4A.

FIG. 5A is a plan view illustrating the method for manufacturing a nonvolatile semiconductor memory according to the embodiment of the present invention, FIG. 5B is a cross-sectional view taken along line X-X' of FIG. 5A, and FIG. 5C is a cross-sectional view taken along line Y-Y' of FIG. 5A.

FIG. 6A is a plan view illustrating the method for manufacturing a nonvolatile semiconductor memory according to the embodiment of the present invention, FIG. 6B is a cross-sectional view taken along line X-X' of FIG. 6A, and FIG. 6C is a cross-sectional view taken along line Y-Y' of FIG. 6A.

FIG. 7A is a plan view illustrating the method for manufacturing a nonvolatile semiconductor memory according to the embodiment of the present invention, FIG. 7B is a cross-sectional view taken along line X-X' of FIG. 7A, and FIG. 7C is a cross-sectional view taken along line Y-Y' of FIG. 7A.

FIG. 10A is a plan view illustrating the method for manufacturing a nonvolatile semiconductor memory according to the embodiment of the present invention, FIG. 10B is a cross-sectional view taken along line X-X' of FIG. 10A, and FIG. 10C is a cross-sectional view taken along line Y-Y' of FIG. 10A.

FIG. 12A is a plan view illustrating the method for manufacturing a nonvolatile semiconductor memory according to the embodiment of the present invention, FIG. 12B is a cross-sectional view taken along line X-X' of FIG. 12A, and FIG. 12C is a cross-sectional view taken along line Y-Y' of FIG. 12A.

FIG. 13A is a plan view illustrating the method for manufacturing a nonvolatile semiconductor memory according to the embodiment of the present invention, FIG. 13B is a cross-sectional view taken along line X-X' of FIG. 13A, and FIG. 13C is a cross-sectional view taken along line Y-Y' of FIG. 13A.

FIG. 14A is a plan view illustrating the method for manufacturing a nonvolatile semiconductor memory according to the embodiment of the present invention, FIG. 14B is a cross-sectional view taken along line X-X' of FIG. 14A, and FIG. 14C is a cross-sectional view taken along line Y-Y' of FIG. 14A.

FIG. 15A is a plan view illustrating the method for manufacturing a nonvolatile semiconductor memory according to the embodiment of the present invention, FIG. 15B is a cross-sectional view taken along line X-X' of FIG. 15A, and FIG. 15C is a cross-sectional view taken along line Y-Y' of FIG. 15A.

FIG. 19A is a plan view illustrating the method for manufacturing a nonvolatile semiconductor memory according to the embodiment of the present invention, FIG. 19B is a cross-sectional view taken along line X-X' of FIG. 19A, and FIG. 19C is a cross-sectional view taken along line Y-Y' of FIG. 19A.

FIG. 20A is a plan view illustrating the method for manufacturing a nonvolatile semiconductor memory according to the embodiment of the present invention, FIG. 20B is a cross-sectional view taken along line X-X' of FIG. 20A, and FIG. 20C is a cross-sectional view taken along line Y-Y' of FIG. 20A.

FIG. 21A is a plan view illustrating the method for manufacturing a nonvolatile semiconductor memory according to the embodiment of the present invention, FIG. 21B is a cross-sectional view taken along line X-X' of FIG. 21A, and FIG. 21C is a cross-sectional view taken along line Y-Y' of FIG. 21A.

FIG. 23A is a plan view illustrating the method for manufacturing a nonvolatile semiconductor memory according to the embodiment of the present invention, FIG. 23B is a cross-sectional view taken along line X-X' of FIG. 23A, and FIG. 23C is a cross-sectional view taken along line Y-Y' of FIG. 23A.

FIG. 24A is a plan view illustrating the method for manufacturing a nonvolatile semiconductor memory according to the embodiment of the present invention, FIG. 24B is a cross-sectional view taken along line X-X' of FIG. 24A, and FIG. 24C is a cross-sectional view taken along line Y-Y' of FIG. 24A.

FIG. 25A is a plan view illustrating the method for manufacturing a nonvolatile semiconductor memory according to the embodiment of the present invention, FIG. 25B is a cross-sectional view taken along line X-X' of FIG. 25A, and FIG. 25C is a cross-sectional view taken along line Y-Y' of FIG. 25A.

FIG. 27A is a plan view illustrating the method for manufacturing a nonvolatile semiconductor memory according to the embodiment of the present invention, FIG. 27B is a cross-sectional view taken along line X-X' of FIG. 27A, and FIG. 27C is a cross-sectional view taken along line Y-Y' of FIG. 27A.

FIG. 28A is a plan view illustrating the method for manufacturing a nonvolatile semiconductor memory according to the embodiment of the present invention, FIG. 28B is a cross-sectional view taken along line X-X' of FIG. 28A, and FIG. 28C is a cross-sectional view taken along line Y-Y' of FIG. 28A.

FIG. 31A is a plan view illustrating the method for manufacturing a nonvolatile semiconductor memory according to the embodiment of the present invention, FIG. 31B is a cross-sectional view taken along line X-X' of FIG. 31A, and FIG. 31C is a cross-sectional view taken along line Y-Y' of FIG. 31A.

FIG. 34A is a plan view illustrating the method for manufacturing a nonvolatile semiconductor memory according to the embodiment of the present invention, FIG. 34B is a cross-sectional view taken along line X-X' of FIG. 34A, and FIG. 34C is a cross-sectional view taken along line Y-Y' of FIG. 34A.

FIG. 35A is a plan view illustrating the method for manufacturing a nonvolatile semiconductor memory according to the embodiment of the present invention, FIG. 35B is a cross-sectional view taken along line X-X' of FIG. 35A, and FIG. 35C is a cross-sectional view taken along line Y-Y' of FIG. 35A.

FIG. 39A is a plan view illustrating the method for manufacturing a nonvolatile semiconductor memory according to the embodiment of the present invention, FIG. 39B is a cross-sectional view taken along line X-X' of FIG. 39A, and FIG. 39C is a cross-sectional view taken along line Y-Y' of FIG. 39A.

FIG. 40A is a plan view illustrating the method for manufacturing a nonvolatile semiconductor memory according to the embodiment of the present invention, FIG. 40B is a cross-sectional view taken along line X-X' of FIG. 40A, and FIG. 40C is a cross-sectional view taken along line Y-Y' of FIG. 40A.

FIG. 41A is a plan view illustrating the method for manufacturing a nonvolatile semiconductor memory according to the embodiment of the present invention, FIG. 41B is a cross-sectional view taken along line X-X' of FIG. 41A, and FIG. 41C is a cross-sectional view taken along line Y-Y' of FIG. 41A.

FIG. 42A is a plan view illustrating the method for manufacturing a nonvolatile semiconductor memory according to the embodiment of the present invention, FIG. 42B is a cross-sectional view taken along line X-X' of FIG. 42A, and FIG. 42C is a cross-sectional view taken along line Y-Y' of FIG. 42A.

FIG. 43A is a plan view illustrating the method for manufacturing a nonvolatile semiconductor memory according to the embodiment of the present invention, FIG. 43B is a cross-sectional view taken along line X-X' of FIG. 43A, and FIG. 43C is a cross-sectional view taken along line Y-Y' of FIG. 43A.

FIG. 44A is a plan view illustrating the method for manufacturing a nonvolatile semiconductor memory according to the embodiment of the present invention, FIG. 44B is a cross-sectional view taken along line X-X' of FIG. 44A, and FIG. 44C is a cross-sectional view taken along line Y-Y' of FIG. 44A.

DETAILED DESCRIPTION

An embodiment of the present invention will be described hereinafter with reference to the drawings. The present invention is not limited to the following embodiment.

Figure 1:
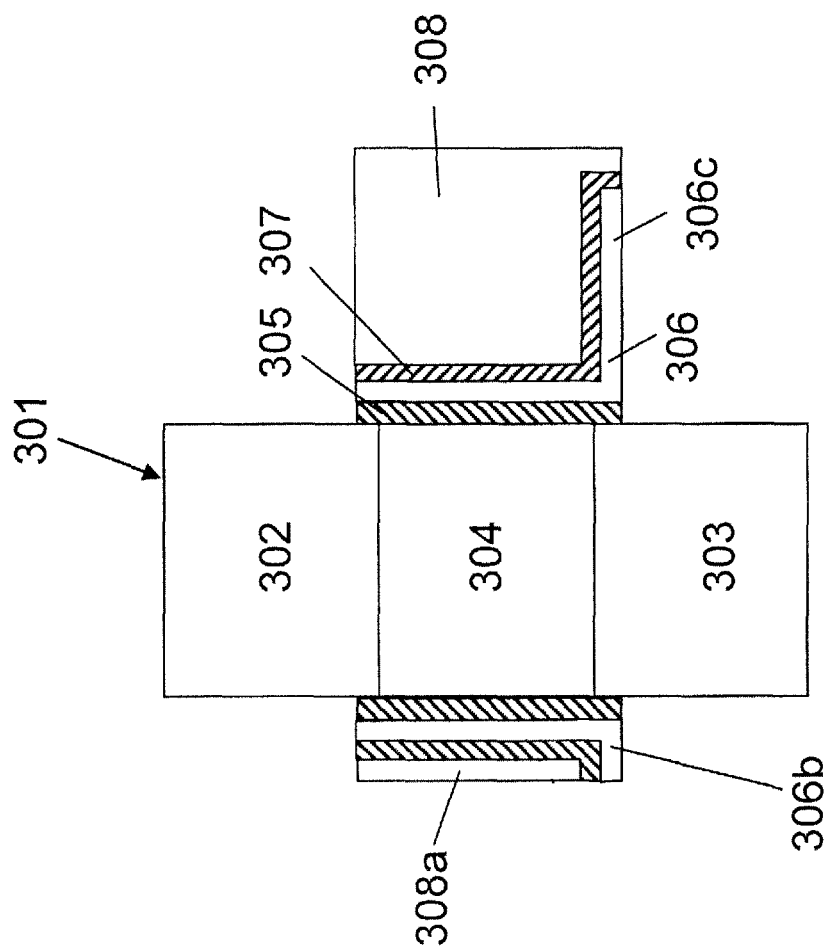
FIG. 1 is a cross-sectional view illustrating a main part of a nonvolatile semiconductor memory transistor according to an embodiment of the present invention.

FIG. 1 illustrates a cross-sectional view of a nonvolatile semiconductor memory transistor according to an embodiment of the present invention.

As illustrated in FIG. 1, the nonvolatile semiconductor memory transistor is configured such that a source region 303, a channel region 304, and a drain region 302 are formed in this order from the substrate side and constitute a cylindrical island-shaped semiconductor 301. The nonvolatile semiconductor memory transistor further includes a floating gate 306 arranged so as to surround the outer periphery of the channel region 304 with a tunnel insulating film 305 interposed between the floating gate 306 and the channel region 304, a control gate 308a arranged so as to surround the outer periphery of the floating gate 306 with an inter-polysilicon insulating film 307 interposed between the control gate 308a and the floating gate 306, and a control gate line 308 electrically connected to the control gate 308a and extending in a predetermined direction (to the right in FIG. 1).

The inter-polysilicon insulating film 307 is arranged so as to be interposed between the floating gate 306 and the lower and inner side surfaces of the control gate 308a and between the floating gate 306 and the lower surface of the control gate line 308.

As illustrated in FIG. 1, the floating gate 306 includes a first floating gate portion 306b facing the lower surface of the control gate 308a, and a second floating gate portion 306c facing the lower surface of the control gate line 308. The first floating gate portion 306b and the second floating gate portion 306c enable an increase in capacitance (electrostatic capacitance) consisting of first capacitance between the floating gate 306 and the control gate 308a and second capacitance between the floating gate 306 and the control gate line 308.

FIG. 2A, FIG. 2B, and FIG. 2C illustrate a plan view of a nonvolatile semiconductor memory according to this embodiment, an X-X' cross-sectional view of FIG. 2A, and a Y-Y' cross-sectional view of FIG. 2A, respectively.

As illustrated in FIG. 2A and FIG. 2B, the nonvolatile semiconductor memory is configured such that a plurality of (in the figures, three) nonvolatile semiconductor memory transistors 201, 202, and 203 each having the structure illustrated in FIG. 1 are arranged in a plurality of row directions among row and column directions on a silicon substrate 101 so as to be aligned in a straight line at substantially equal angles and intervals.

In the nonvolatile semiconductor memory illustrated in FIG. 2A to FIG. 2C, the nonvolatile semiconductor memory transistor 201 is arranged in the first column in the column direction among the row and column directions on the silicon substrate 101.

As illustrated in FIG. 2A, FIG. 2B, and FIG. 2C, in the nonvolatile semiconductor memory transistor 201, a source region 121, a channel region 124, and a drain region 156 are formed in this order from the silicon substrate 101 side, and constitute an island-shaped semiconductor 113.

The nonvolatile semiconductor memory transistor 201 includes a floating gate 139 that is arranged so as to surround the outer periphery of the channel region 124 in such a manner that a tunnel insulating film 132 is interposed between the floating gate 139 and the channel region 124, and a control gate 153a that is arranged so as to surround the outer periphery of the floating gate 139 in such a manner that an inter-polysilicon insulating film 142 is interposed between the control gate 153a and the floating gate 139. A control gate line 153 extending in a predetermined direction (to the left and right in FIG. 2B) between the nonvolatile semiconductor memory transistors 201 and 202 is electrically connected to the control gate 153a (in FIG. 2B, the control gate 153a and the control gate line 153 are illustrated in an integrated manner).

As illustrated in FIG. 2B, the floating gate 139 includes a portion facing the lower surface of the control gate 153a (which corresponds to the first floating gate portion 306b in FIG. 1), and a portion facing the lower surface of the control gate line 153 (which corresponds to the second floating gate portion 306c in FIG. 1).

In the nonvolatile semiconductor memory transistor 201, an oxide film (first insulating film) 128 that is thicker than the tunnel insulating film 132 and the inter-polysilicon insulating film 142 is arranged on the lower surface of the floating gate 139. Here, the thickness of the oxide film 128 is larger than the thickness of the tunnel insulating film 132 and the inter-polysilicon insulating film 142. However, this is not meant to be limiting, and the oxide film 128 may be thicker than at least one of the tunnel insulating film 132 and the inter-polysilicon insulating film 142.

In the nonvolatile semiconductor memory illustrated in FIG. 2A to FIG. 2C, the nonvolatile semiconductor memory transistor 202 is arranged in the second column in the column direction among the row and column directions on the silicon substrate 101.

As illustrated in FIG. 2A, FIG. 2B, and FIG. 2C, in the nonvolatile semiconductor memory transistor 202, a source region 122, a channel region 125, and a drain region 157 are formed in this order from the silicon substrate 101 side, and constitute an island-shaped semiconductor 114.

The nonvolatile semiconductor memory transistor 202 includes a floating gate 140 that is arranged so as to surround the outer periphery of the channel region 125 in such a manner that a tunnel insulating film 133 is interposed between the floating gate 140 and the channel region 125, and a control gate 153b that is arranged so as to surround the outer periphery of the floating gate 140 in such a manner that the inter-polysilicon insulating film 142 is interposed between the control gate 153b and the floating gate 140. The control gate line 153 extending in a predetermined direction (to the left and right in FIG. 2B) between the nonvolatile semiconductor memory transistors 202 and 203 is electrically connected to the control gate 153b (in FIG. 2B, the control gate 153b and the control gate line 153 are illustrated in an integrated manner).

As illustrated in FIG. 2B, the floating gate 140 includes a portion facing the lower surface of the control gate 153b (which corresponds to the first floating gate portion 306b in FIG. 1), and a portion facing the lower surface of the control gate line 153 (which corresponds to the second floating gate portion 306c in FIG. 1).

In the nonvolatile semiconductor memory transistor 202, the oxide film (first insulating film) 128 that is thicker than the tunnel insulating film 133 and the inter-polysilicon insulating film 142 is arranged on the lower surface of the floating gate 140. Here, the thickness of the oxide film 128 is larger than the thickness of the tunnel insulating film 133 and the inter-polysilicon insulating film 142. However, this is not meant to be limiting, and the oxide film 128 may be thicker than at least one of the tunnel insulating film 133 and the inter-polysilicon insulating film 142.

In the nonvolatile semiconductor memory illustrated in FIG. 2A to FIG. 2C, the nonvolatile semiconductor memory transistor 203 is arranged in the third column in the column direction among the row and column directions on the silicon substrate 101.

As illustrated in FIG. 2A, FIG. 2B, and FIG. 2C, in the nonvolatile semiconductor memory transistor 203, a source region 123, a channel region 126, and a drain region 158 are formed in this order from the silicon substrate 101 side, and constitute an island-shaped semiconductor 115.

The nonvolatile semiconductor memory transistor 203 includes a floating gate 141 that is arranged so as to surround the outer periphery of the channel region 126 in such a manner that a tunnel insulating film 134 is interposed between the floating gate 141 and the channel region 126, and a control gate 153c that is arranged so as to surround the outer periphery of the floating gate 141 in such a manner that the inter-polysilicon insulating film 142 is interposed between the control gate 153c and the floating gate 141. The control gate line 153 extending in a predetermined direction (to the left and right in FIG. 2B) is electrically connected to the control gate 153c (in FIG. 2B, the control gate 153c and the control gate line 153 are illustrated in an integrated manner).

As illustrated in FIG. 2B, the floating gate 141 includes a portion facing the lower surface of the control gate 153c (which corresponds to the first floating gate portion 306b in FIG. 1), and a portion facing the lower surface of the control gate line 153 (which corresponds to the second floating gate portion 306c in FIG. 1).

In the nonvolatile semiconductor memory transistor 203, the oxide film (first insulating film) 128 that is thicker than the tunnel insulating film 134 and the inter-polysilicon insulating film 142 is arranged on the lower surface of the floating gate 141. Here, the thickness of the oxide film 128 is larger than the thickness of the tunnel insulating film 134 and the inter-polysilicon insulating film 142. However, this is not meant to be limiting, and the oxide film 128 may be thicker than at least one of the tunnel insulating film 134 and the inter-polysilicon insulating film 142.

In the nonvolatile semiconductor memory illustrated in FIG. 2A to FIG. 2C, the source regions 121, 122, and 123 of the nonvolatile semiconductor memory transistors 201, 202, and 203 are formed in lower portions of the island-shaped semiconductors 113, 114, and 115 of the nonvolatile semiconductor memory transistors 201, 202, and 203, respectively, and are electrically connected to a source line 120 on the top of the silicon substrate 101. Further, the drain regions 156, 157, and 158 of the nonvolatile semiconductor memory transistors 201, 202, and 203 are connected to bit lines 183, 184, and 185 via contacts 176, 177, and 178, respectively.

As illustrated in FIG. 2A to FIG. 2C, the control gate line 153 extends in a predetermined direction so as to connect the control gates 153a, 153b, and 153c of the adjacent island-shaped semiconductors 113, 114, and 115.

An example of a manufacturing process for forming a memory cell array structure of the nonvolatile semiconductor memory according to the embodiment of the present invention will be described hereinafter with reference to FIGS. 3A to 45C.

Referring to FIG. 3A to FIG. 3C, an oxide film 102 is formed on the top of a silicon substrate 101. After that, a nitride film 103 is deposited from above the oxide film 102.

Subsequently, referring to FIG. 4A to FIG. 4C, resists 104, 105, and 106 for forming island-shaped semiconductors 113, 114, and 115 (see FIG. 2A to FIG. 2C) are formed at predetermined positions on the top of the nitride film 103.

Subsequently, referring to FIG. 5A to FIG. 5C, the nitride film 103 and the oxide film 102 are etched by reactive ion etching (RIE) using the resists 104, 105, and 106 as masks. Thereby, a hard mask made of a nitride film 107 and an oxide film 110, a hard mask made of a nitride film 108 and an oxide film 111, and a hard mask made of a nitride film 109 and an oxide film 112 are formed on the top of the silicon substrate 101.

Subsequently, referring to FIG. 6A to FIG. 6C, further, the silicon substrate 101 is etched by reactive ion etching using the resists 104, 105, and 106 as masks, and the island-shaped semiconductors 113, 114, and 115 are formed.

Subsequently, referring to FIG. 7A to FIG. 7C, the resists 104, 105, and 106 are stripped.

Figure 8A:
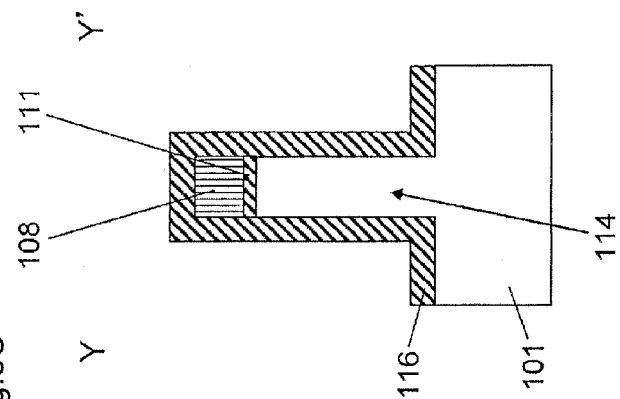
FIG. 8A is a plan view illustrating the method for manufacturing a nonvolatile semiconductor memory according to the embodiment of the present invention.
Figure 8B:
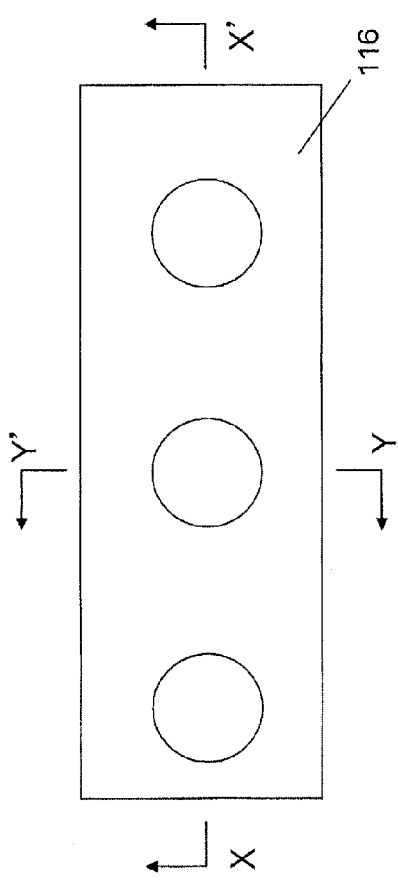
FIG. 8B is a cross-sectional view taken along line X-X' of FIG. 8A.
Figure 8C:
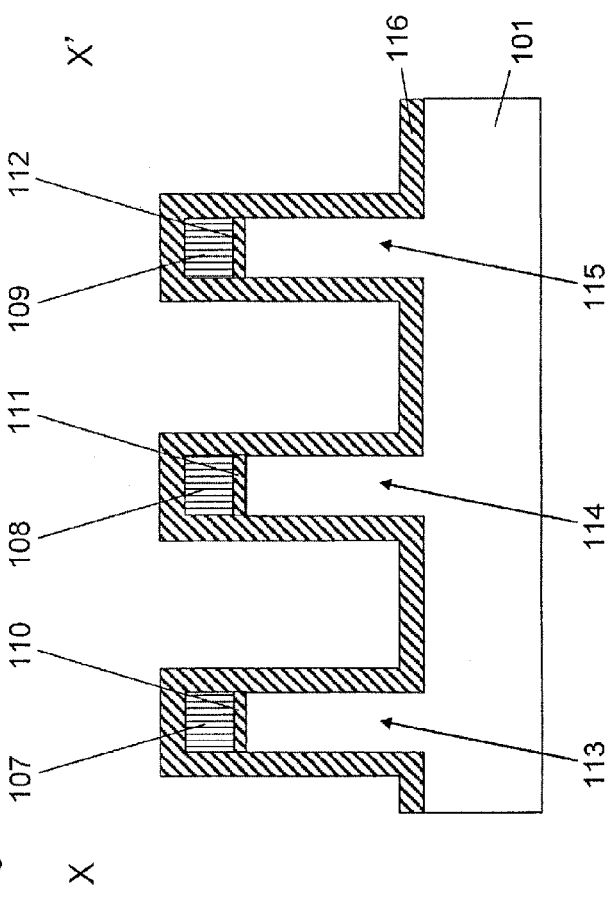
FIG. 8C is a cross-sectional view taken along line Y-Y' of FIG. 8A.

Subsequently, referring to FIG. 8A to FIG. 8C, an oxide film 116 is deposited on the outer peripheral wall surfaces of the island-shaped semiconductors 113, 114, and 115 and the bottom surfaces of the gaps between the island-shaped semiconductors 113, 114, and 115.

Figure 9C:
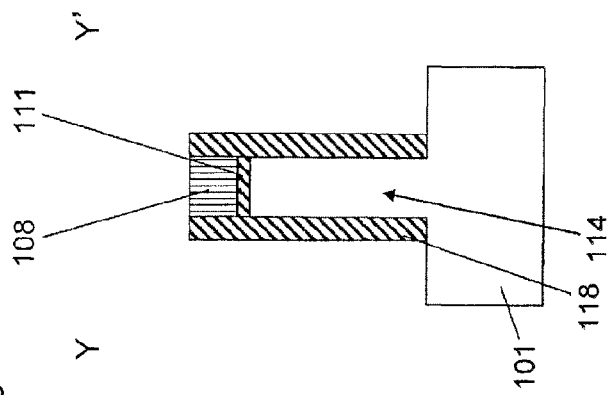
FIG. 9C is a cross-sectional view taken along line Y-Y' of FIG. 9A.
Figure 9A:
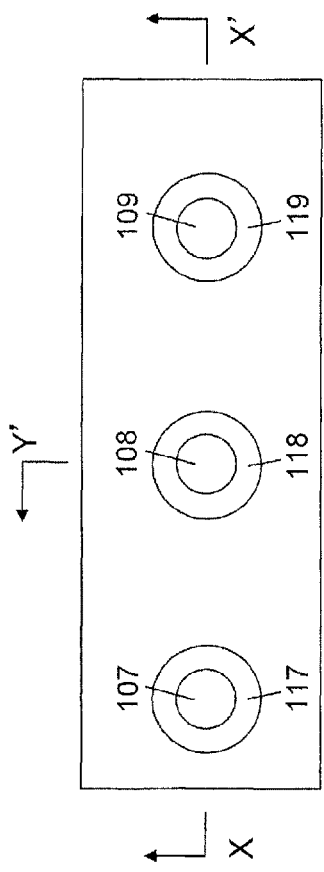
FIG. 9A is a plan view illustrating the method for manufacturing a nonvolatile semiconductor memory according to the embodiment of the present invention.
Figure 9B:
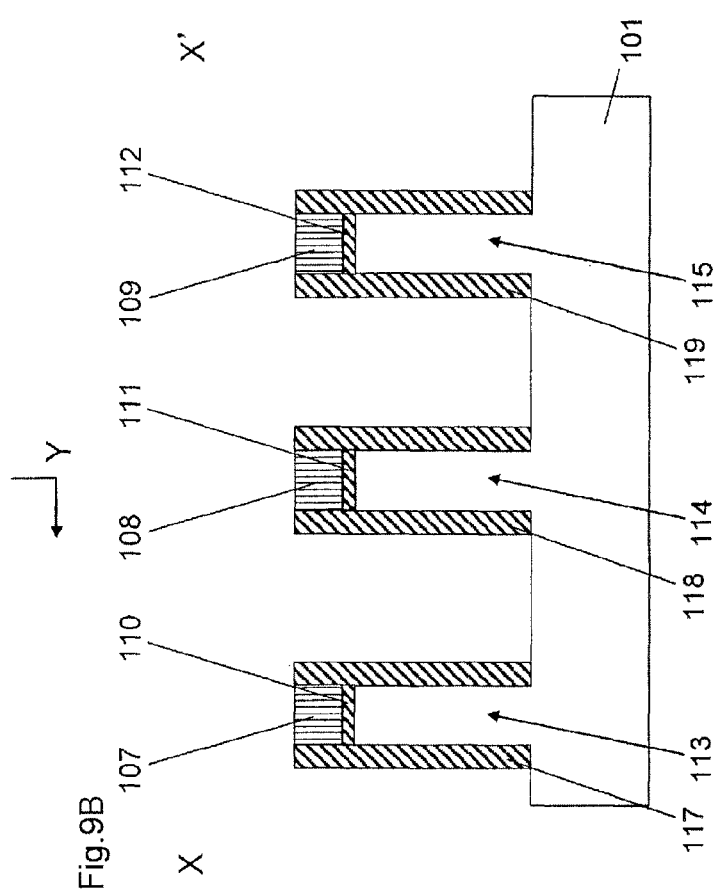
FIG. 9B is a cross-sectional view taken along line X-X' of FIG. 9A.

Subsequently, referring to FIG. 9A to FIG. 9C, the oxide film 116 is etched, and oxide film sidewalls 117, 118, and 119 are formed on the outer peripheral wall surfaces of the island-shaped semiconductors 113, 114, and 115, respectively.

Subsequently, referring to FIG. 10A to FIG. 10C, arsenic (see arrows As) is injected into the silicon substrate 101 to form a source line 120 that is an n-type (second conductivity type) semiconductor on the surface of the silicon substrate 101. Further, source regions 121, 122, and 123 are formed in lower portions of the island-shaped semiconductors 113, 114, and 115 (see FIG. 9A to FIG. 9C), respectively, so as to be electrically connected to the source line 120. At this time, channel regions 124, 125, and 126 are formed between the source region 121 and the nitride film 107 and oxide film 110, between the source region 122 and the nitride film 108 and oxide film 111, and between the source region 123 and the nitride film 109 and oxide film 112, respectively.

Figure 11A:
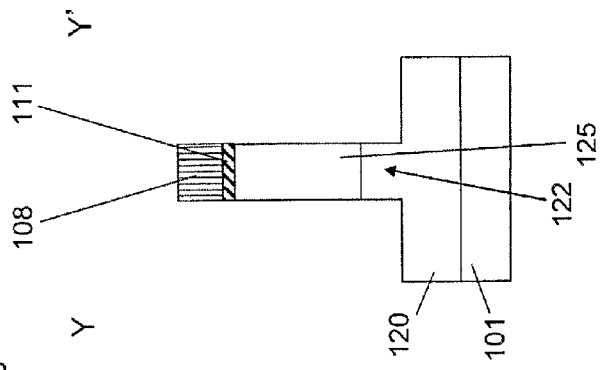
FIG. 11A is a plan view illustrating the method for manufacturing a nonvolatile semiconductor memory according to the embodiment of the present invention.
Figure 11B:
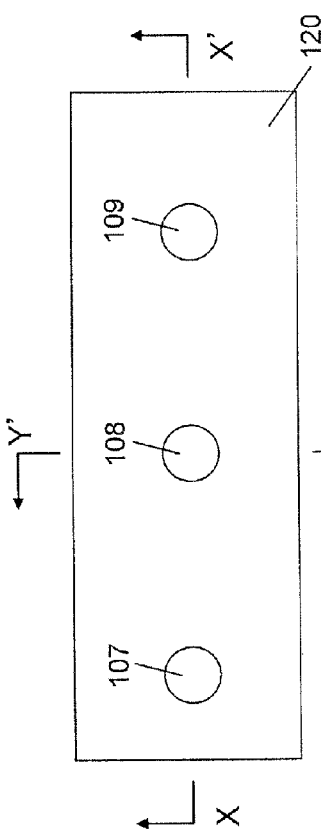
FIG. 11B is a cross-sectional view taken along line X-X' of FIG. 11A.
Figure 11C:
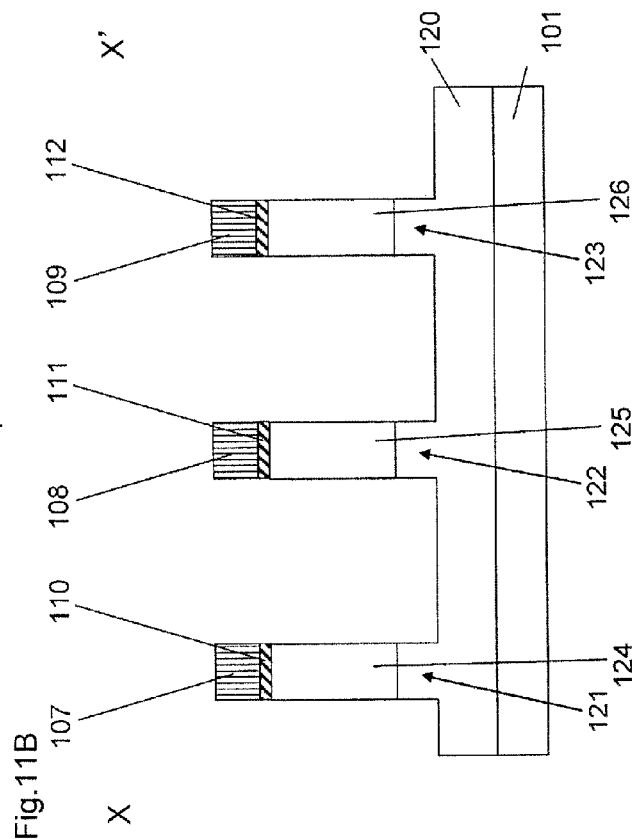
FIG. 11C is a cross-sectional view taken along line Y-Y' of FIG. 11A.

Subsequently, referring to FIG. 11A to FIG. 11C, the oxide film sidewalls 117, 118, and 119 are removed by etching.

Subsequently, referring to FIG. 12A to FIG. 12C, an oxide film 127 is deposited on the top of the source line 120, on the top of the nitride films 107, 108, and 109, and on the outer peripheral wall surfaces of the island-shaped semiconductors 113, 114, and 115 (see FIG. 9A to FIG. 9C) so that the oxide film 127 on the top of the source line 120 and the nitride films 107, 108, and 109 becomes thick while the oxide film 127 on the outer peripheral wall surfaces becomes thin.

Subsequently, referring to FIG. 13A to FIG. 13C, the portions of the oxide film 127 deposited on the outer peripheral wall surfaces of the island-shaped semiconductors 113, 114, and 115 (see FIG. 9A to FIG. 9C) are etched by isotropic etching. Therefore, even after the removal of the portions of the oxide film 127 on the outer peripheral wall surfaces of the island-shaped semiconductors 113, 114, and 115 by etching, an oxide film 128 which is an insulating film remains on the gaps between the adjacent island-shaped semiconductors 113, 114, and 115 (see FIG. 9A to FIG. 9C) and on the top of the source line 120. Further, oxide films 129, 130, and 131 remain in a disk shape on the top of the nitride films 107, 108, and 109, respectively. In this manner, the oxide film 127 remains as the oxide films 129, 130, and 131 because of the following reason: Referring to FIG. 12A to FIG. 12C, the oxide film 127 is deposited on the top of the source line 120 and on the top of the nitride films 107, 108, and 109 so as to become thick while the oxide film 127 is deposited on the outer peripheral wall surfaces of the island-shaped semiconductors 113, 114, and 115 so as to become thin, and, additionally, the oxide film 127 has been subjected to isotropic etching in which etching progresses at the same speed in all directions. The oxide film 128 remaining on the top of the source line 120 becomes the first insulating film 128 (see FIG. 2B to FIG. 2C) in resulting nonvolatile semiconductor memory transistors 201, 202, and 203, respectively, and contributes to the reduction in the capacitance between the floating gates 139, 140, and 141 and the source line 120.

Subsequently, referring to FIG. 14A to FIG. 14C, tunnel insulating films 132, 133, and 134 are formed on the outer peripheral wall surfaces of the island-shaped semiconductors 113, 114, and 115 (see FIG. 9A to FIG. 9C), respectively, by gate oxidation.

Subsequently, referring to FIG. 15A to FIG. 15C, a polysilicon layer 135 that becomes a floating gate is deposited using a conductive material such as polysilicon.

Figure 16C:
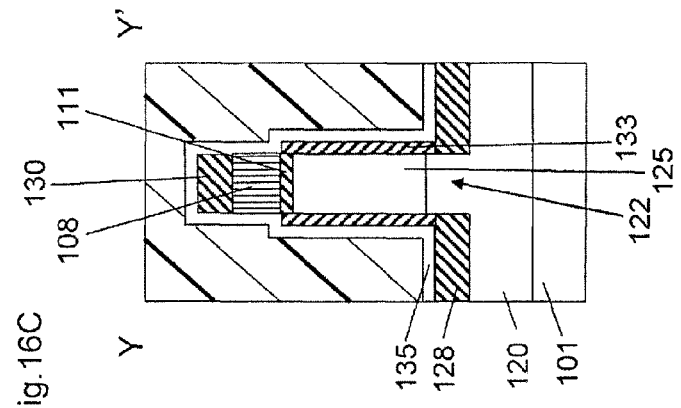
FIG. 16C is a cross-sectional view taken along line Y-Y' of FIG. 16A.
Figure 16A:
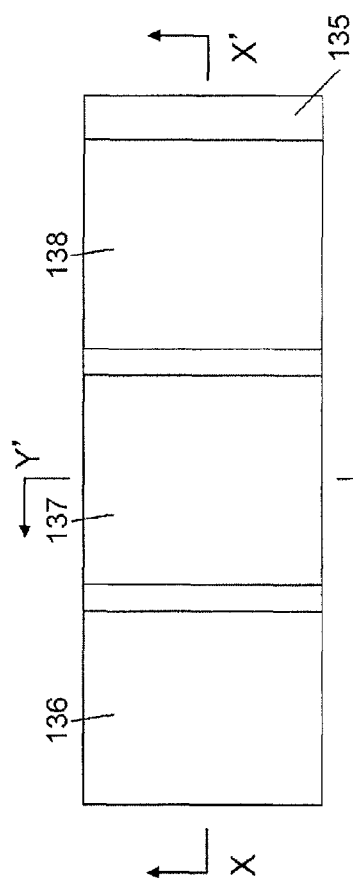
FIG. 16A is a plan view illustrating the method for manufacturing a nonvolatile semiconductor memory according to the embodiment of the present invention.
Figure 16B:
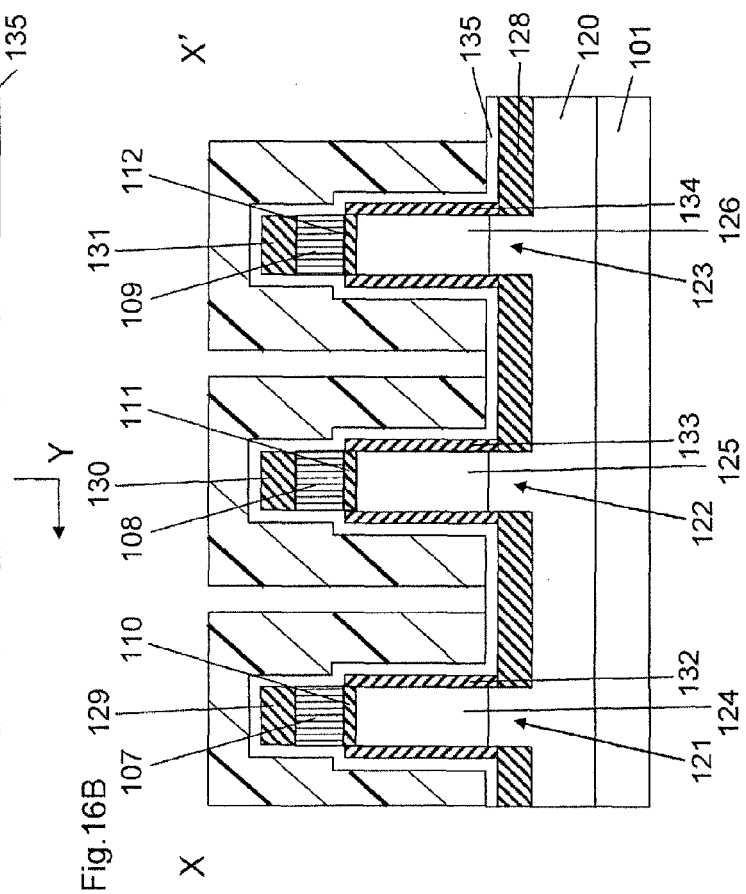
FIG. 16B is a cross-sectional view taken along line X-X' of FIG. 16A.

Subsequently, referring to FIG. 16A to FIG. 16C, resists 136, 137, and 138 are formed so as to cover the island-shaped semiconductors 113, 114, and 115 that are adjacent to each other (see FIG. 9A to FIG. 9C), respectively. The resists 136, 137, and 138 have grooves that are arranged between the resists 136 and 137 and between the resists 137 and 138 and that extend in a direction perpendicular to the predetermined direction (to the left and right in FIG. 16B) in which the control gate line 153 extends. The control gate line 153 extends in the predetermined direction (see FIG. 2A to FIG. 2C) so as to connect the control gates 153a, 153b, and 153c of the adjacent island-shaped semiconductors 113, 114, and 115 (see FIG. 9A to FIG. 9C).

Figure 17A:
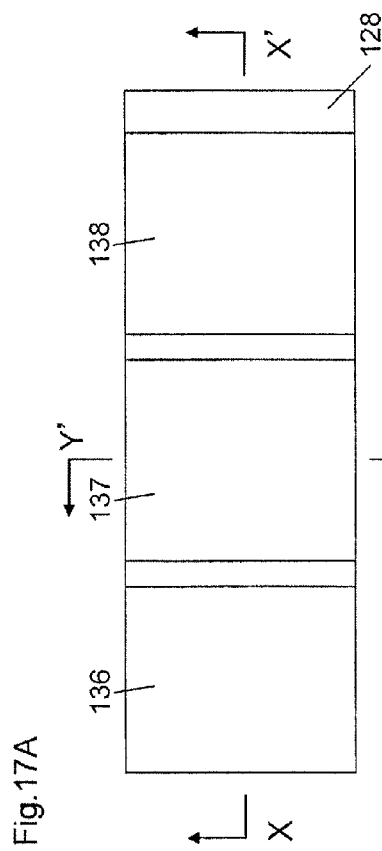
FIG. 17A is a plan view illustrating the method for manufacturing a nonvolatile semiconductor memory according to the embodiment of the present invention.
Figure 17C:
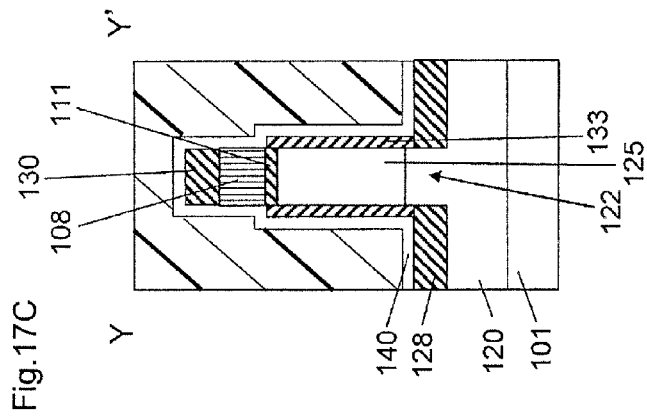
FIG. 17C is a cross-sectional view taken along line Y-Y' of FIG. 17A.
Figure 17B:
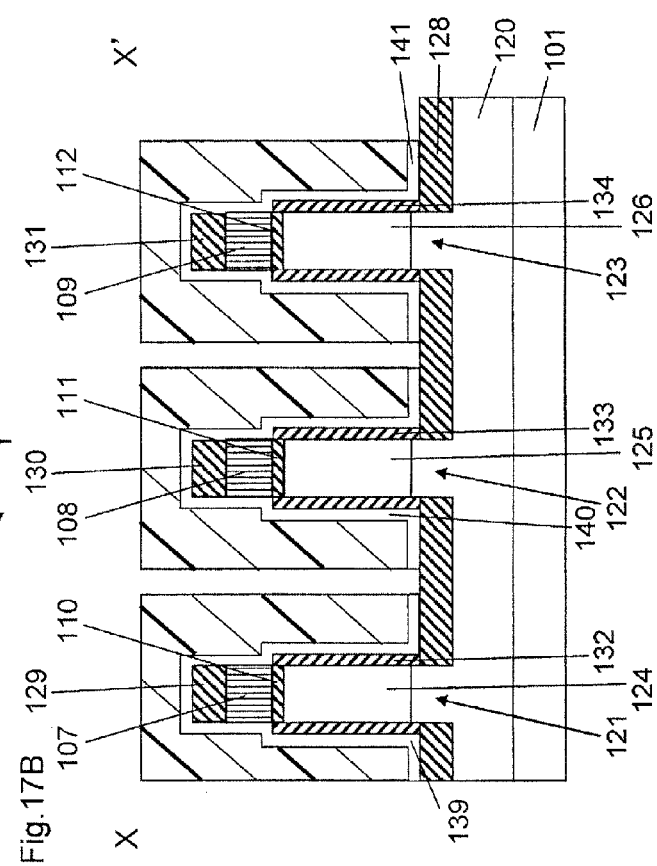
FIG. 17B is a cross-sectional view taken along line X-X' of FIG. 17A.

Subsequently, referring to FIG. 17A to FIG. 17C, the polysilicon layer 135 is separated from portions that are on the oxide film 128 and that are lower regions of the grooves by etching using the resists 136, 137, and 138 as masks, and floating gates 139, 140, and 141 are formed for the island-shaped semiconductors 113, 114, and 115, respectively (see FIG. 9A to FIG. 9C).

Figure 18C:
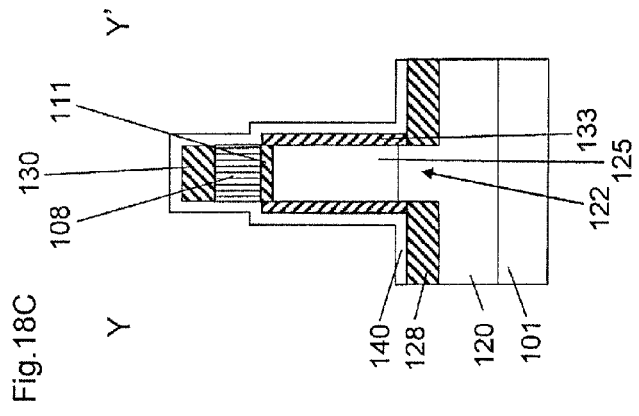
FIG. 18C is a cross-sectional view taken along line Y-Y' of FIG. 18A.
Figure 18A:
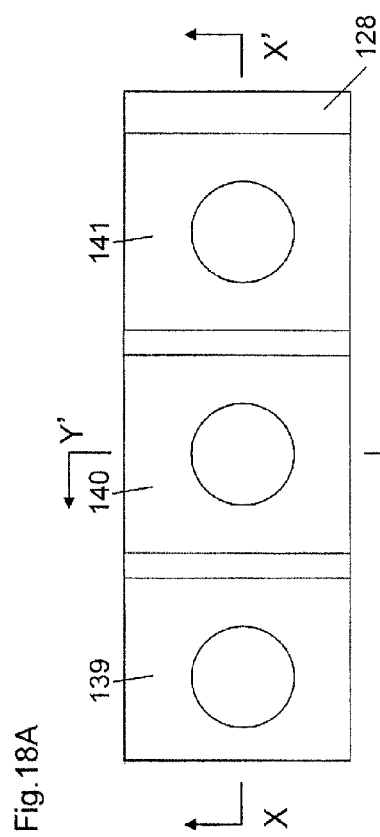
FIG. 18A is a plan view illustrating the method for manufacturing a nonvolatile semiconductor memory according to the embodiment of the present invention.
Figure 18B:
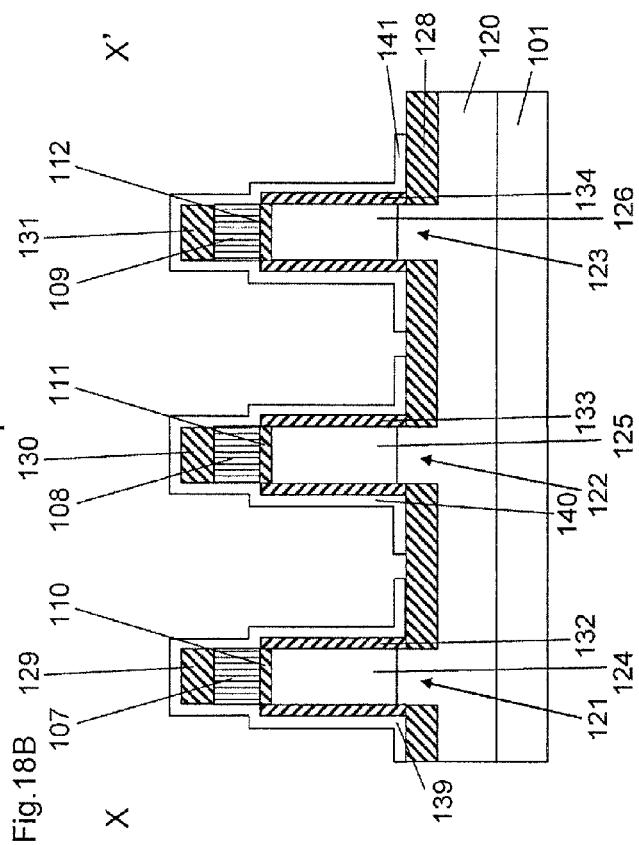
FIG. 18B is a cross-sectional view taken along line X-X' of FIG. 18A.

Subsequently, referring to FIG. 18A to FIG. 18C, the resists 136, 137, and 138 are stripped.

Subsequently, referring to FIG. 19A to FIG. 19C, an inter-polysilicon insulating film 142 is formed from above the oxide film 128 on the top of the source line 120, the floating gates 139, 140, and 141, and the oxide films 129, 130, and 131. After that, a polysilicon layer 143 is deposited on the top of the inter-polysilicon insulating film 142, and planarized using CMP (Chemical Mechanical Polishing) so that the tip portions of the oxide films 129, 130, and 131 are exposed. Here, the inter-polysilicon insulating film 142 may be formed of either a layered structure of an oxide film, an oxide film, a nitride film, and an oxide film, or of a high dielectric film.

Subsequently, referring to FIG. 20A to FIG. 20C, the oxide films 129, 130, and 131 are removed by etching.

Subsequently, referring to FIG. 21A to FIG. 21C, the polysilicon layer 143 is etched back to a predetermined depth by etching.

Figure 22C:
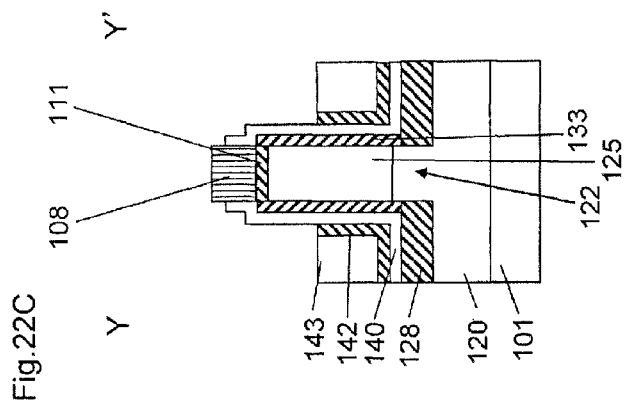
FIG. 22C is a cross-sectional view taken along line Y-Y' of FIG. 22A.
Figure 22A:
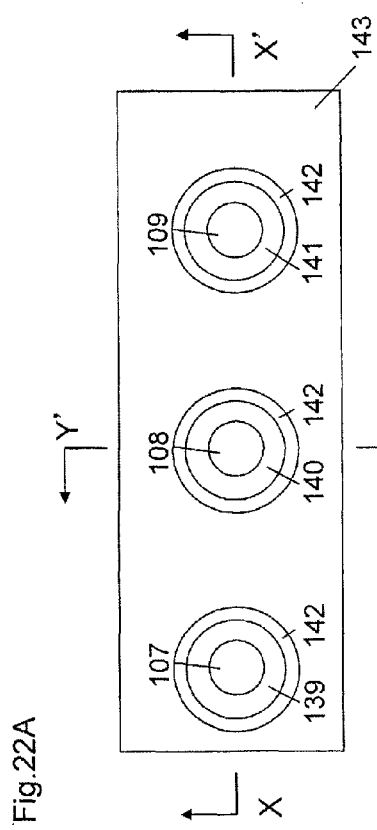
FIG. 22A is a plan view illustrating the method for manufacturing a nonvolatile semiconductor memory according to the embodiment of the present invention.
Figure 22B:
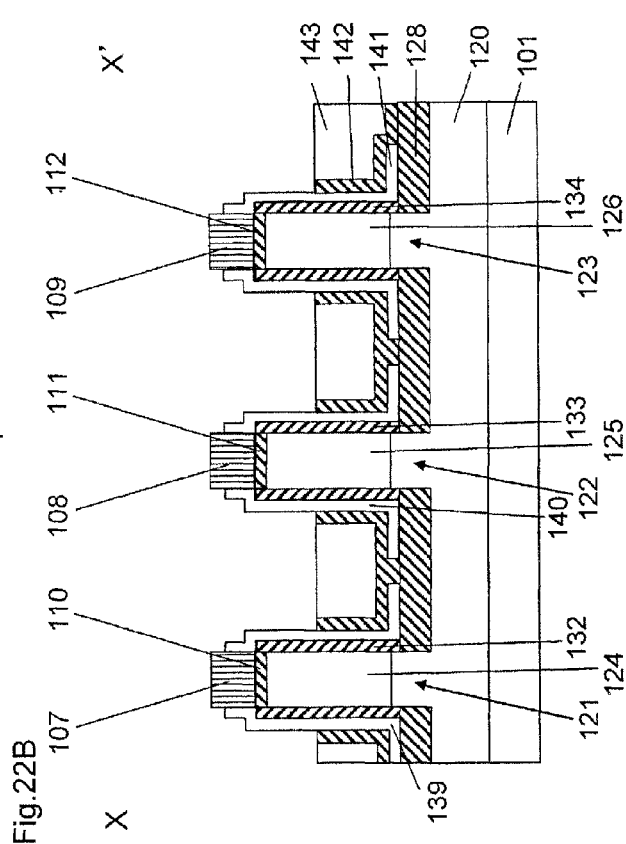
FIG. 22B is a cross-sectional view taken along line X-X' of FIG. 22A.

Subsequently, referring to FIG. 22A to FIG. 22C, the exposed portions of the inter-polysilicon insulating film 142 are removed by etching.

Subsequently, referring to FIG. 23A to FIG. 23C, the exposed portions of the floating gates 139, 140, and 141 and a portion of the polysilicon layer 143 are removed by etching. With this etching, the gate length of the resulting nonvolatile semiconductor memory transistors 201, 202, and 203 is determined.

Subsequently, referring to FIG. 24A to FIG. 24C, an oxide film 144 is deposited. After that, a nitride film 145 is deposited from above the oxide film 144.

Subsequently, referring to FIG. 25A to FIG. 25C, the nitride film 145 and the oxide film 144 are etched by anisotropic etching. Further, the nitride film 145 and the oxide film 144 (see FIG. 24A to FIG. 24C) remain in a sidewall shape on the outer peripheral wall surfaces of the island-shaped semiconductors 113, 114, and 115 and the tunnel insulating films 132, 133, and 134, and on the outer peripheral wall surfaces of the nitride film 107 and oxide film 110, the nitride film 108 and oxide film 111, and the nitride film 109 and oxide film 112. Therefore, an insulating film sidewall 501 made of a nitride film 146 and an oxide film 149, an insulating film sidewall 502 made of a nitride film 147 and an oxide film 150, and an insulating film sidewall 503 made of a nitride film 148 and an oxide film 151 are formed for the island-shaped semiconductors 113, 114, and 115, respectively (see FIG. 9A to FIG. 9C).

Figure 26A:
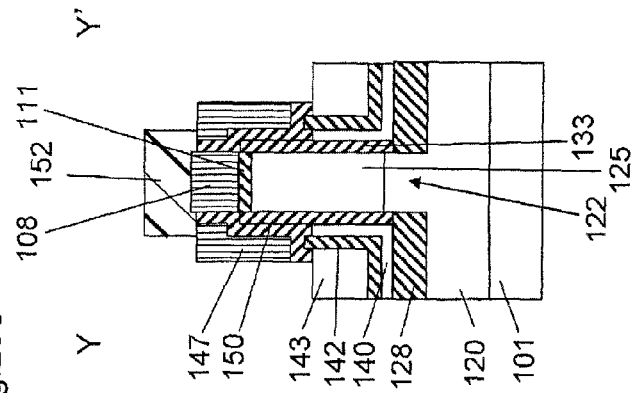
FIG. 26A is a plan view illustrating the method for manufacturing a nonvolatile semiconductor memory according to the embodiment of the present invention.
Figure 26B:
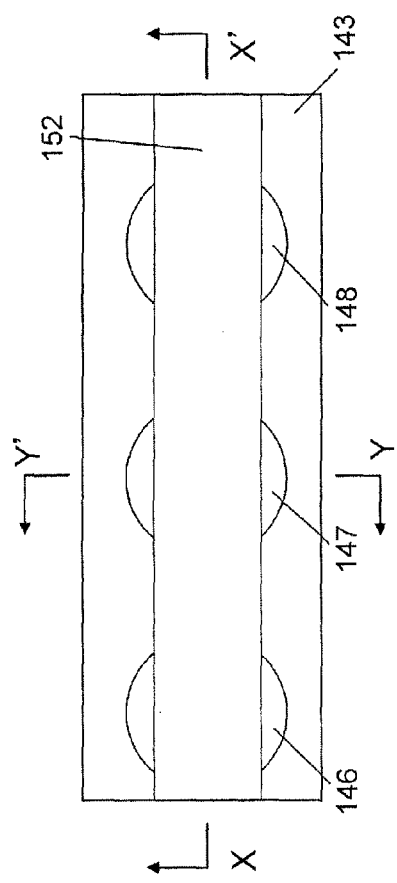
FIG. 26B is a cross-sectional view taken along line X-X' of FIG. 26A.
Figure 26C:
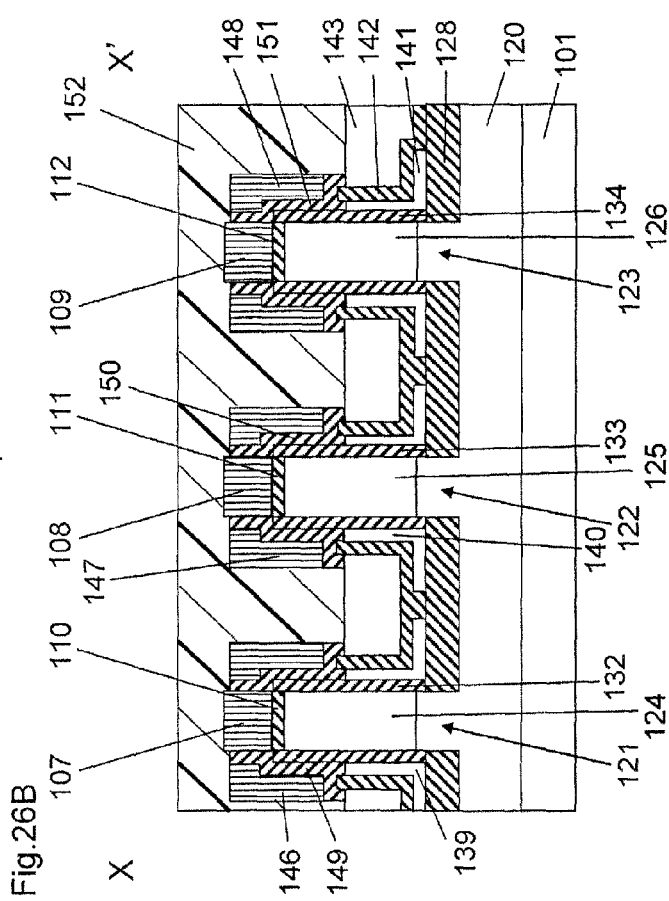
FIG. 26C is a cross-sectional view taken along line Y-Y' of FIG. 26A.

Subsequently, referring to FIG. 26A to FIG. 26C, a resist 152 for forming a control gate line 153 so as to extend to the left and right in FIG. 26A and FIG. 26B to cover the insulating film sidewalls 501, 502, 503 and the nitride films 107, 108, and 109 is formed.

Subsequently, referring to FIG. 27A to FIG. 27C, the polysilicon layer 143, the inter-polysilicon insulating film 142, and the floating gates 139, 140, and 141 are etched using the insulating film sidewalls 501, 502, and 503 and the resist 152 as masks to form control gates 153a, 153b, and 153c and the control gate line 153. Thus, in the resulting nonvolatile semiconductor memory transistors 201, 202, and 203, a structure in which the floating gates 139, 140, and 141 include portions facing the lower surfaces of the control gates 153a, 153b, and 153c, respectively, and also include portions facing the lower surfaces of the control gate line 153 is formed.

Subsequently, referring to FIG. 28A to FIG. 28C, the exposed portions of the oxide film 128 are etched, and a first insulating film 128 is formed.

Figure 29A:
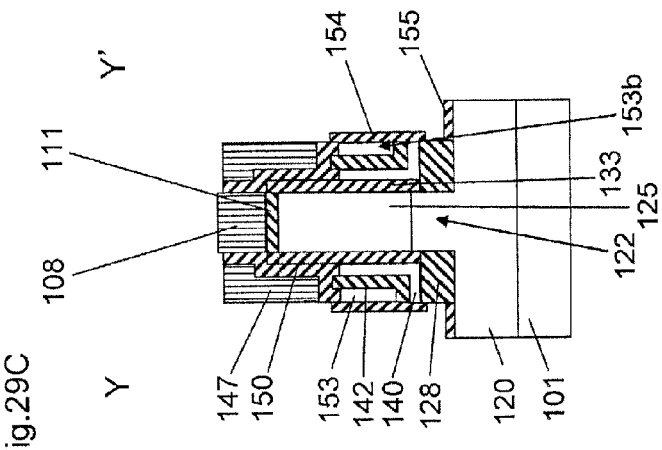
FIG. 29A is a plan view illustrating the method for manufacturing a nonvolatile semiconductor memory according to the embodiment of the present invention.
Figure 29B:
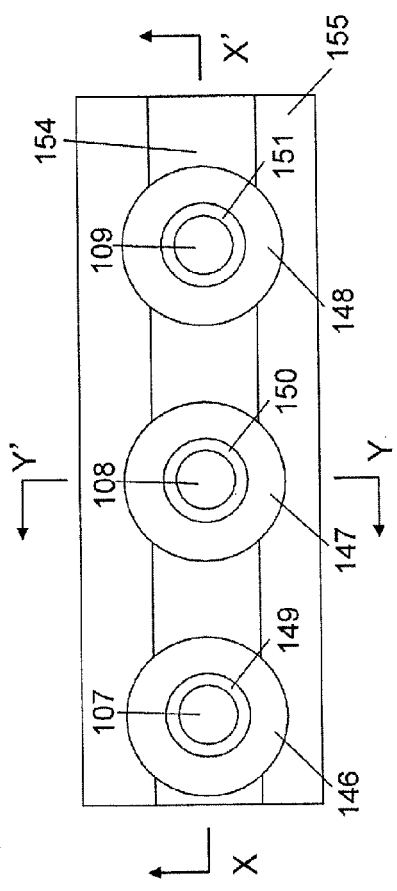
FIG. 29B is a cross-sectional view taken along line X-X' of FIG. 29A.
Figure 29C:
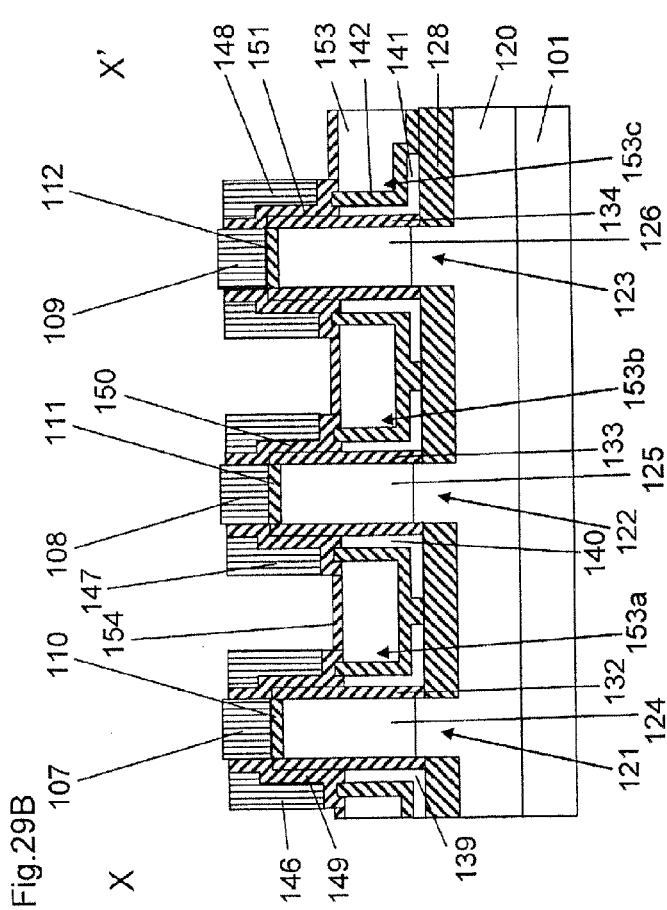
FIG. 29C is a cross-sectional view taken along line Y-Y' of FIG. 29A.

Subsequently, referring to FIG. 29A to FIG. 29C, the resist 152 is stripped, and the surface layer portions of the control gate line 153, the floating gates 139, 140, and 141, and the source line 120 are oxidized to deposit an oxide film 154 on the top of the control gate line 153 and the floating gates 139, 140, and 141 and to deposit an oxide film 155 on the top of the source line 120.

Figure 30C:
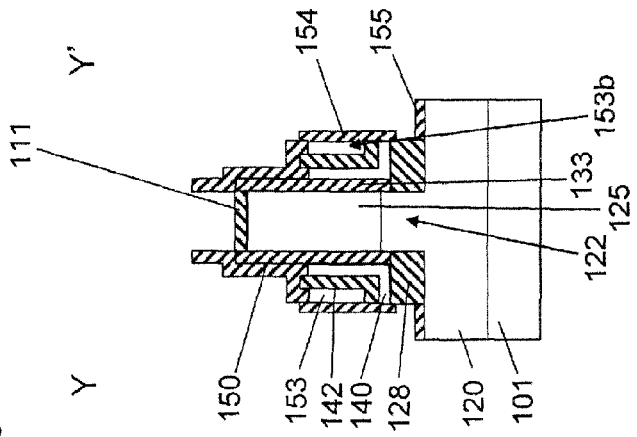
FIG. 30C is a cross-sectional view taken along line Y-Y' of FIG. 30A.
Figure 30A:
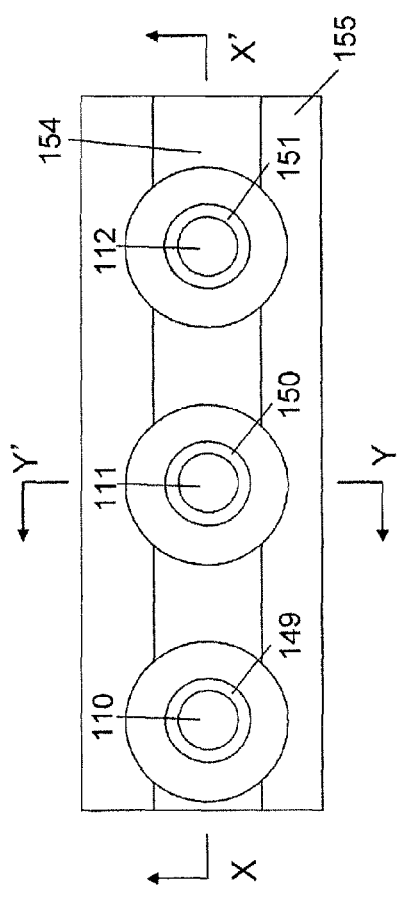
FIG. 30A is a plan view illustrating the method for manufacturing a nonvolatile semiconductor memory according to the embodiment of the present invention.
Figure 30B:
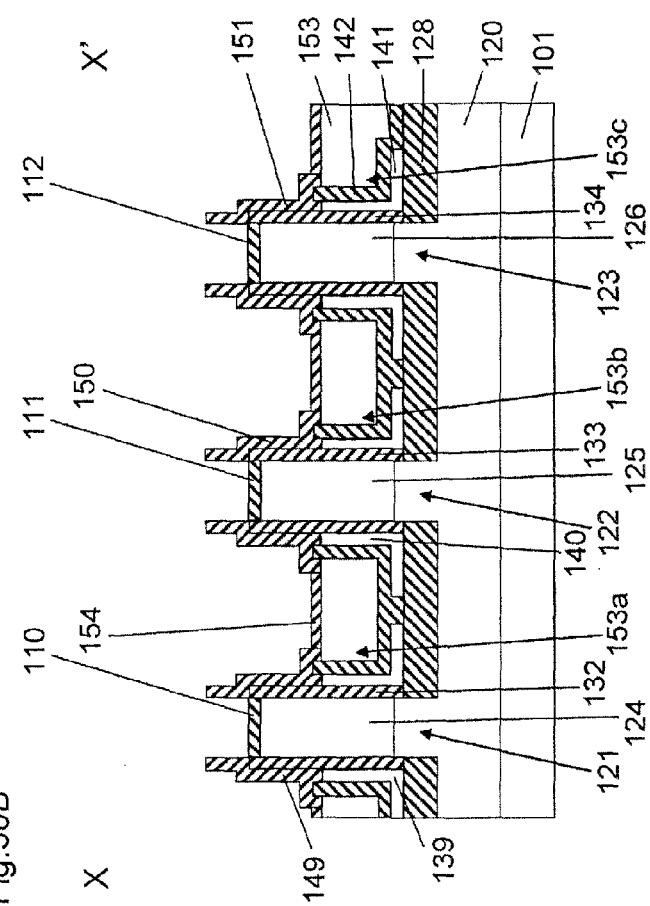
FIG. 30B is a cross-sectional view taken along line X-X' of FIG. 30A.

Subsequently, referring to FIG. 30A to FIG. 30C, the nitride films 107, 108, and 109 and the nitride films 146, 147, and 148 are stripped.

Subsequently, referring to FIG. 31A to FIG. 31C, the oxide films 110, 111, and 112, the oxide films 149, 150, and 151, the oxide films 154 and 155, and the tunnel insulating films 132, 133, and 134 are stripped, and the channel regions 124, 125, and 126 of the island-shaped semiconductors 113, 114, and 115 (see FIG. 9A to FIG. 9C) are exposed.

Figure 32C:
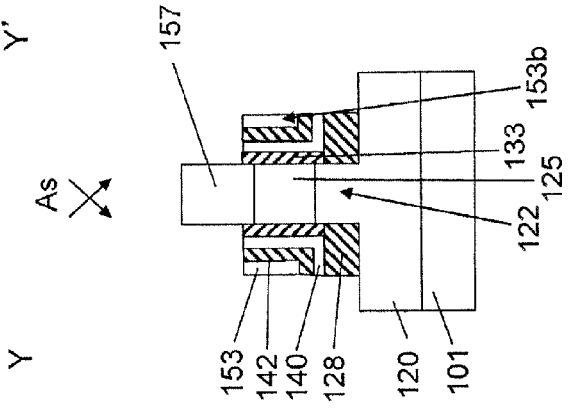
FIG. 32C is a cross-sectional view taken along line Y-Y' of FIG. 32A.
Figure 32A:
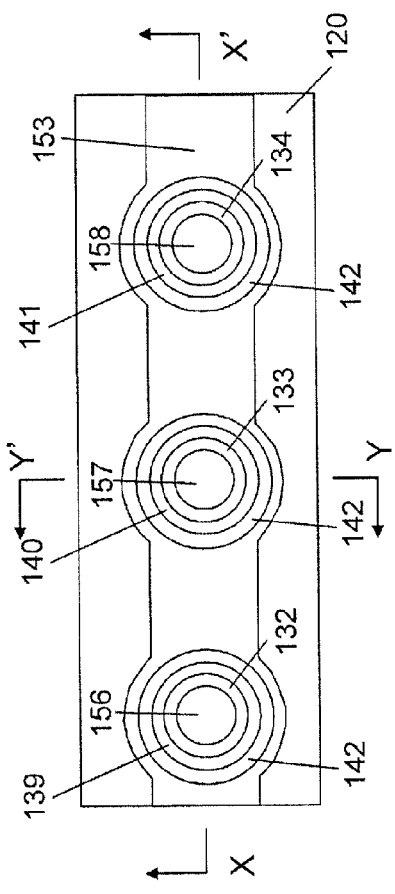
FIG. 32A is a plan view illustrating the method for manufacturing a nonvolatile semiconductor memory according to the embodiment of the present invention.
Figure 32B:
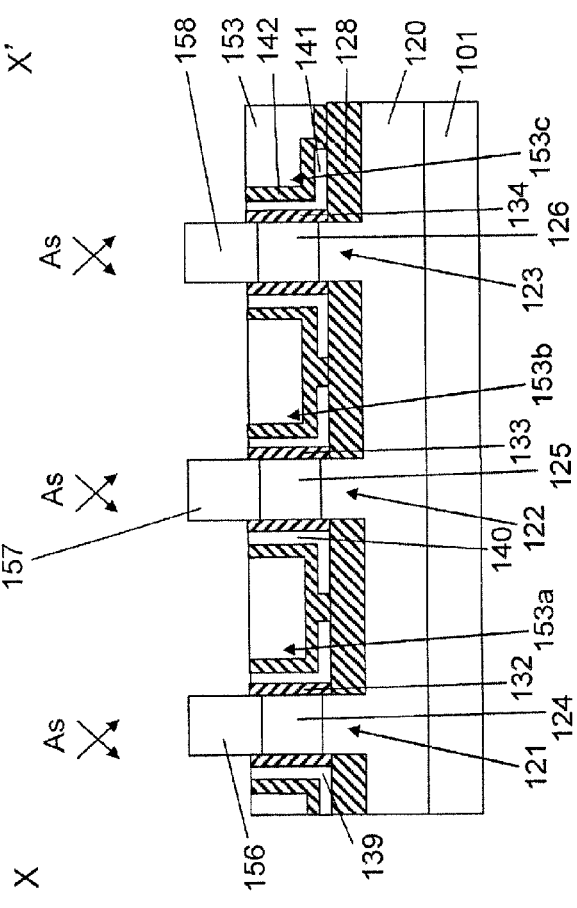
FIG. 32B is a cross-sectional view taken along line X-X' of FIG. 32A.

Subsequently, referring to FIG. 32A to FIG. 32C, arsenic (see arrows As) is injected into the top layer portions of the channel regions 124, 125, and 126 of the island-shaped semiconductors 113, 114, and 115, respectively, and drain regions 156, 157, and 158 that are n-type semiconductors are formed.

Figure 33A:
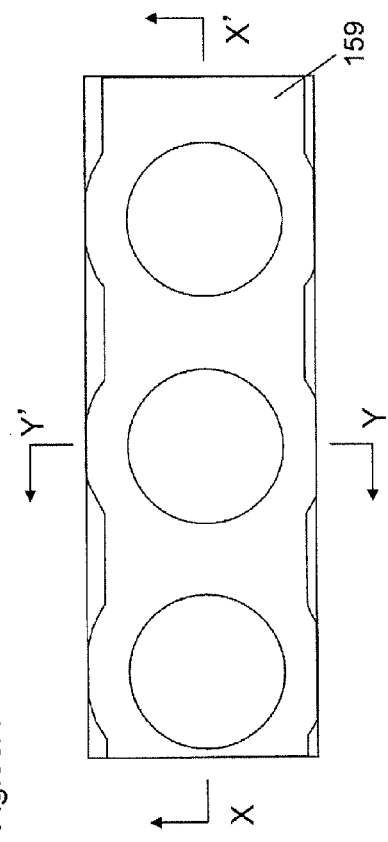
FIG. 33A is a plan view illustrating the method for manufacturing a nonvolatile semiconductor memory according to the embodiment of the present invention.
Figure 33C:
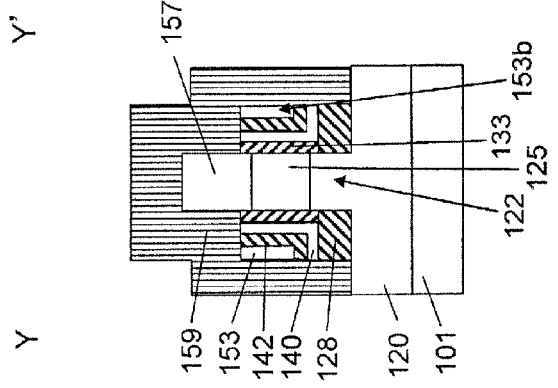
FIG. 33C is a cross-sectional view taken along line Y-Y' of FIG. 33A.
Figure 33B:
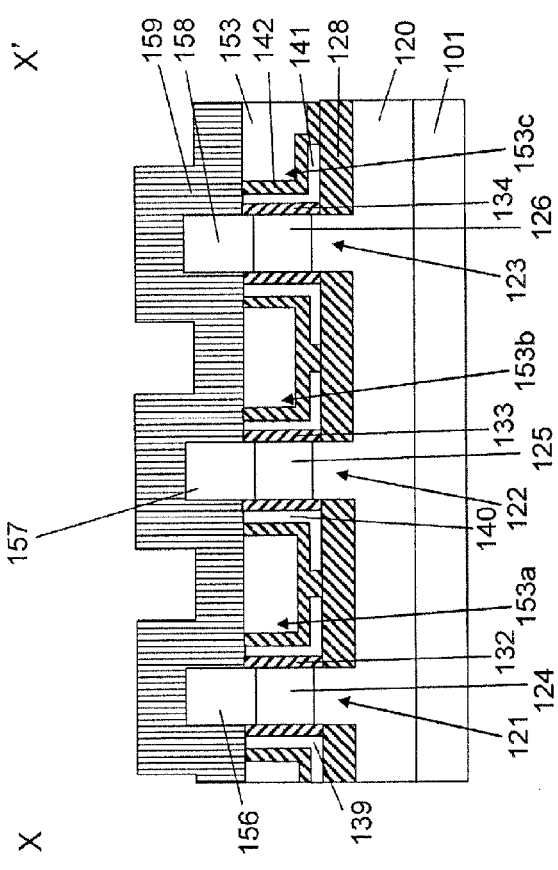
FIG. 33B is a cross-sectional view taken along line X-X' of FIG. 33A.

Subsequently, referring to FIG. 33A to FIG. 33C, a nitride film 159 is deposited so as to cover the island-shaped semiconductors 113, 114, and 115 (see FIG. 9A to FIG. 9C) and the source line 120.

Subsequently, referring to FIG. 34A to FIG. 34C, the nitride film 159 is etched so as to remain in a sidewall shape on the side walls of the island-shaped semiconductors 113, 114, and 115 (see FIG. 9A to FIG. 9C) and on the side wall of the control gate line 153 to form nitride film sidewalls 160, 161, 162, and 163, respectively.

Subsequently, referring to FIG. 35A to FIG. 35C, in order to reduce the resistance, the island-shaped semiconductors 113, 114, and 115, the control gate line 153, and the source line 120 are subjected to a silicide process using a metal material, and metal semiconductor compounds 164, 165, 166, 167, 168, and 169 are formed.

Figure 36A:
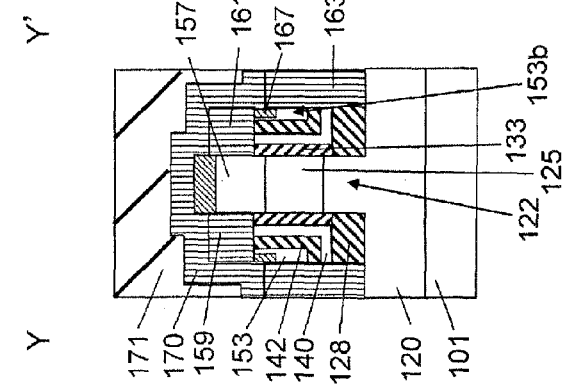
FIG. 36A is a plan view illustrating the method for manufacturing a nonvolatile semiconductor memory according to the embodiment of the present invention.
Figure 36B:
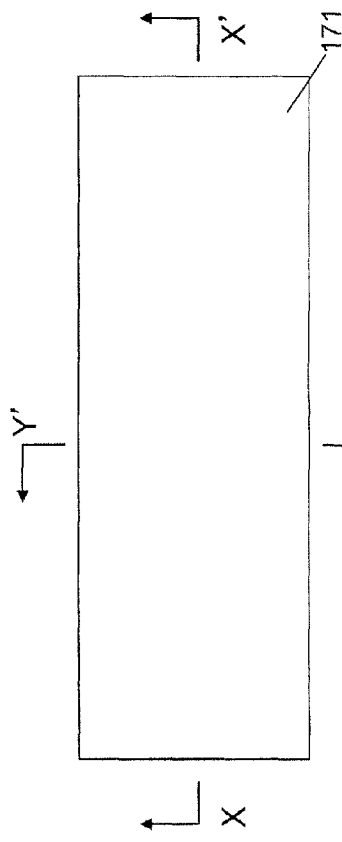
FIG. 36B is a cross-sectional view taken along line X-X' of FIG. 36A.
Figure 36C:
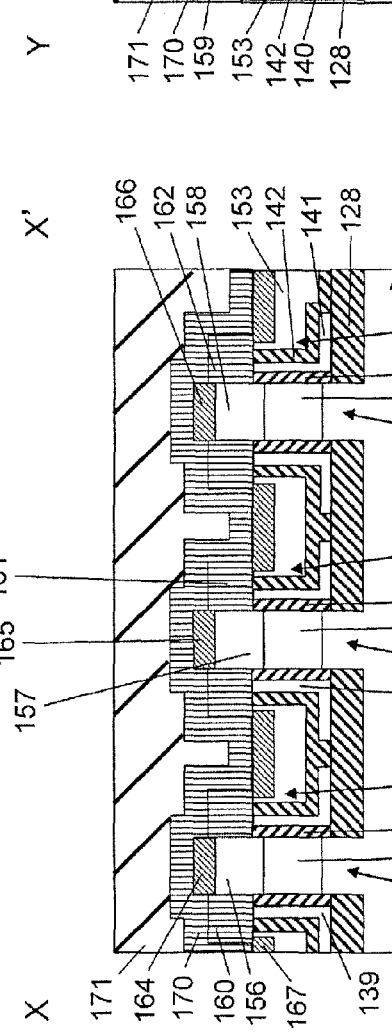
FIG. 36C is a cross-sectional view taken along line Y-Y' of FIG. 36A.

Subsequently, referring to FIG. 36A to FIG. 36C, a contact stopper 170 is deposited using an insulating material so as to cover the island-shaped semiconductors 113, 114, and 115 and the nitride film sidewalls 160, 161, 162, and 163. Additionally, an interlayer film 171 is deposited on the top layer of the contact stopper 170, and thereafter planarized using CMP.

Figure 37A:
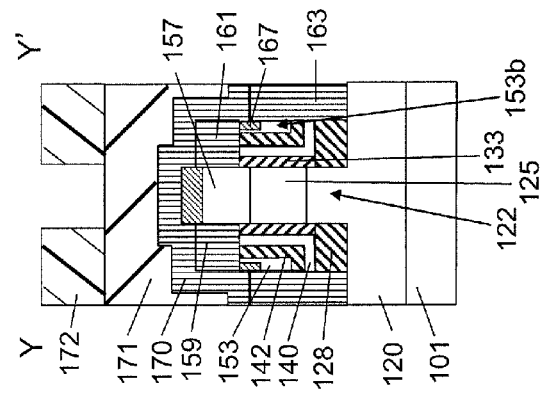
FIG. 37A is a plan view illustrating the method for manufacturing a nonvolatile semiconductor memory according to the embodiment of the present invention.
Figure 37B:
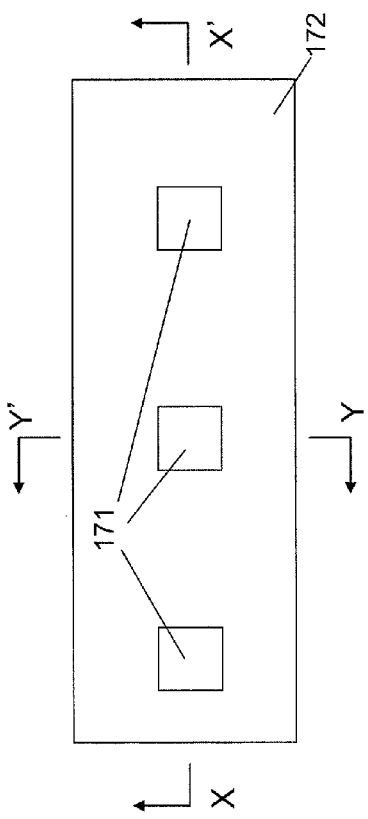
FIG. 37B is a cross-sectional view taken along line X-X' of FIG. 37A.
Figure 37C:
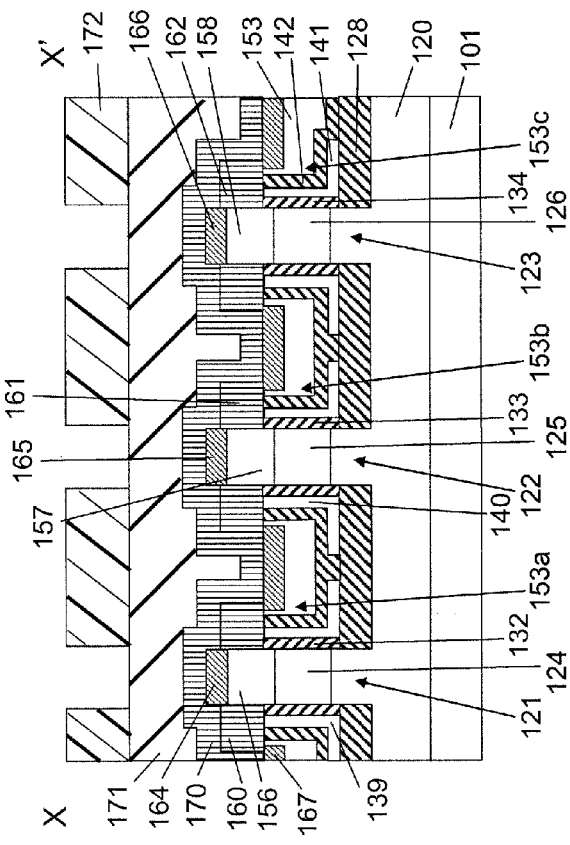
FIG. 37C is a cross-sectional view taken along line Y-Y' of FIG. 37A.

Subsequently, referring to FIG. 37A to FIG. 37C, a resist 172 for forming contact holes 173, 174, and 175 (see FIG. 38A to FIG. 38C) is formed at a predetermined position on the top of the interlayer film 171.

Figure 38A:
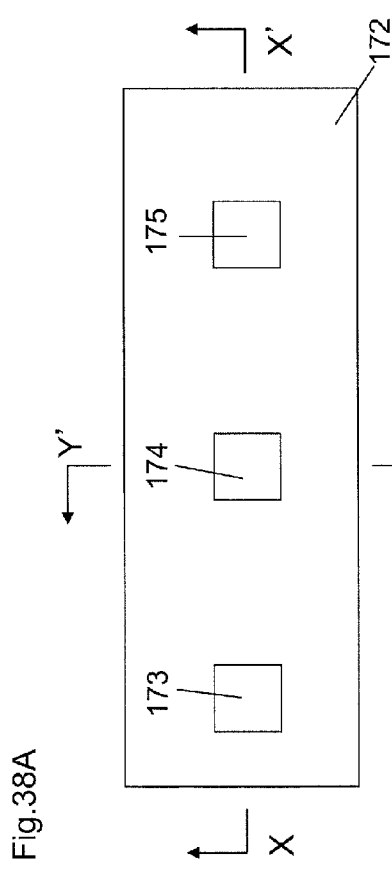
FIG. 38A is a plan view illustrating the method for manufacturing a nonvolatile semiconductor memory according to the embodiment of the present invention.
Figure 38C:
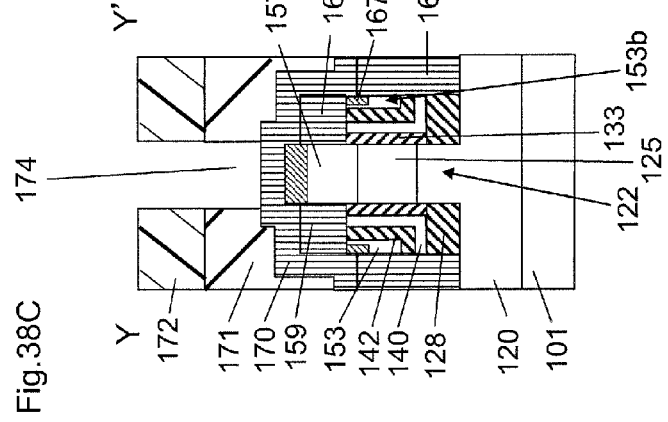
FIG. 38C is a cross-sectional view taken along line Y-Y' of FIG. 38A.
Figure 38B:
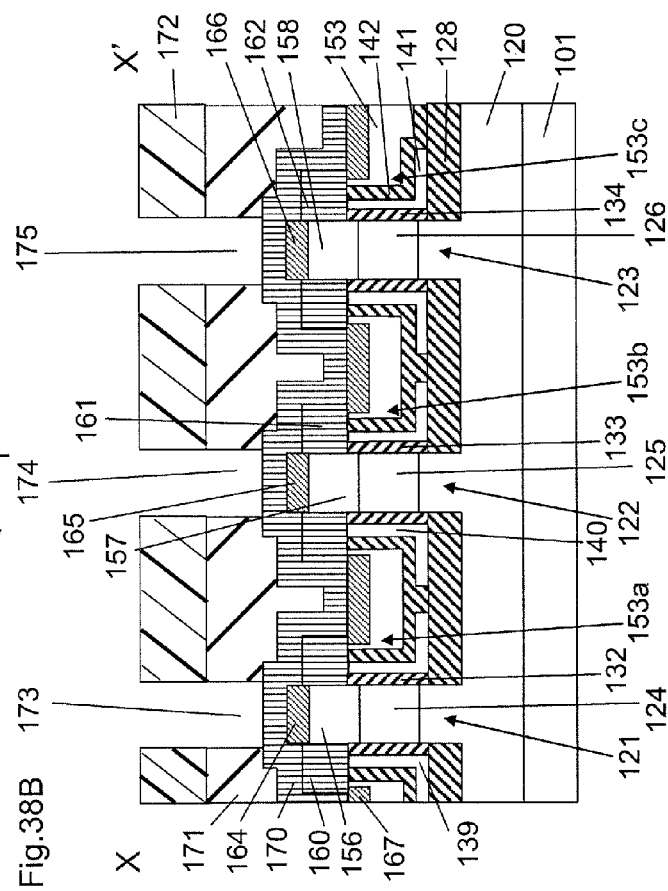
FIG. 38B is a cross-sectional view taken along line X-X' of FIG. 38A.

Subsequently, referring to FIG. 38A to FIG. 38C, the interlayer film 171 is etched using the resist 172 as a mask to form the contact holes 173, 174, and 175, and the surface portions of the contact stopper 170 are exposed.

Subsequently, referring to FIG. 39A to FIG. 39C, the resist 172 is stripped.

Subsequently, referring to FIG. 40A to FIG. 40C, the portions of the contact stopper 170 which are located on the bottom portions of the contact holes 173, 174, and 175 are removed by etching.

Subsequently, referring to FIG. 41A to FIG. 41C, contacts 176, 177, and 178 are formed using a conductive material in the contact holes 173, 174, and 175, respectively, and are electrically connected to the drain regions 156, 157, and 158 of the island-shaped semiconductors 113, 114, and 115 (see FIG. 9A to FIG. 9C), respectively.

Subsequently, referring to FIG. 42A to FIG. 42C, a metal 179 is deposited using a metal material on the top of the interlayer film 171 and the contacts 176, 177, and 178.

Subsequently, referring to FIG. 43A to FIG. 43C, resists 180, 181, and 182 for forming bit lines 183, 184, and 185 of the resulting nonvolatile semiconductor memory transistors 201, 202, and 203, respectively, are formed on the top of the metal 179.

Subsequently, referring to FIG. 44A to FIG. 44C, the metal 179 is etched using the resists 180, 182, and 183 as masks to form the bit lines 183, 184, and 185.

Figure 45C:
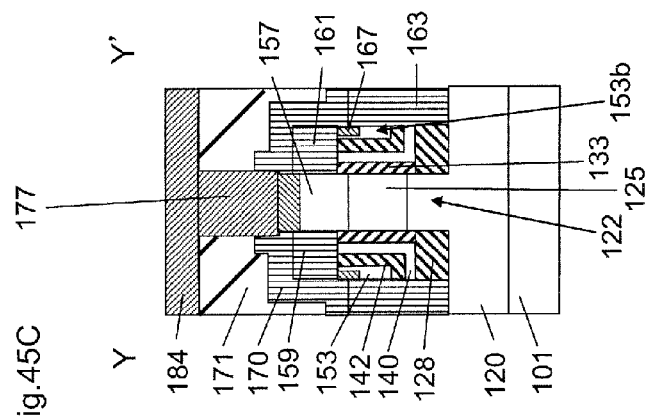
FIG. 45C is a cross-sectional view taken along line Y-Y' of FIG. 45A.
Figure 45A:
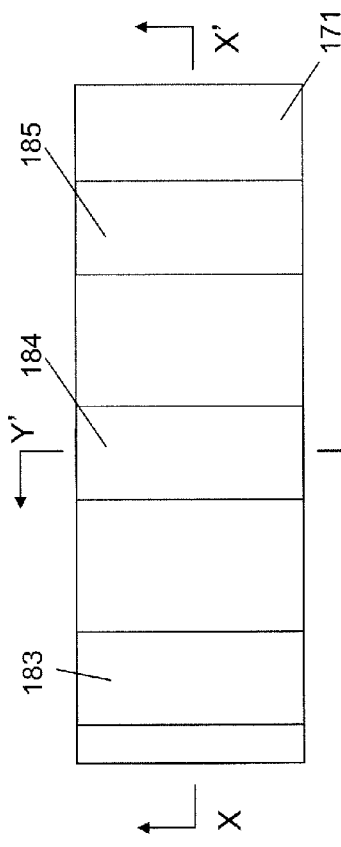
FIG. 45A is a plan view illustrating the method for manufacturing a nonvolatile semiconductor memory according to the embodiment of the present invention.
Figure 45B:
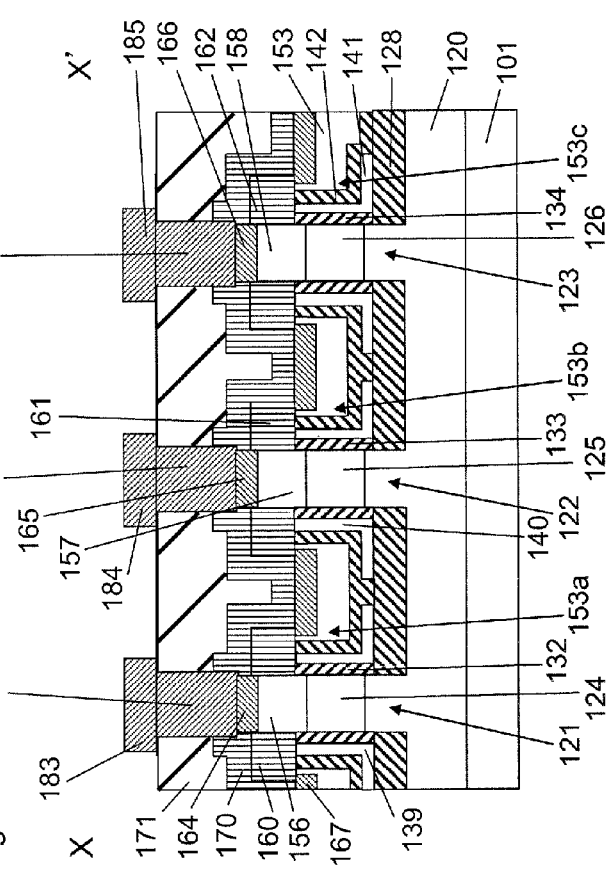
FIG. 45B is a cross-sectional view taken along line X-X' of FIG. 45A.
Figure 46:
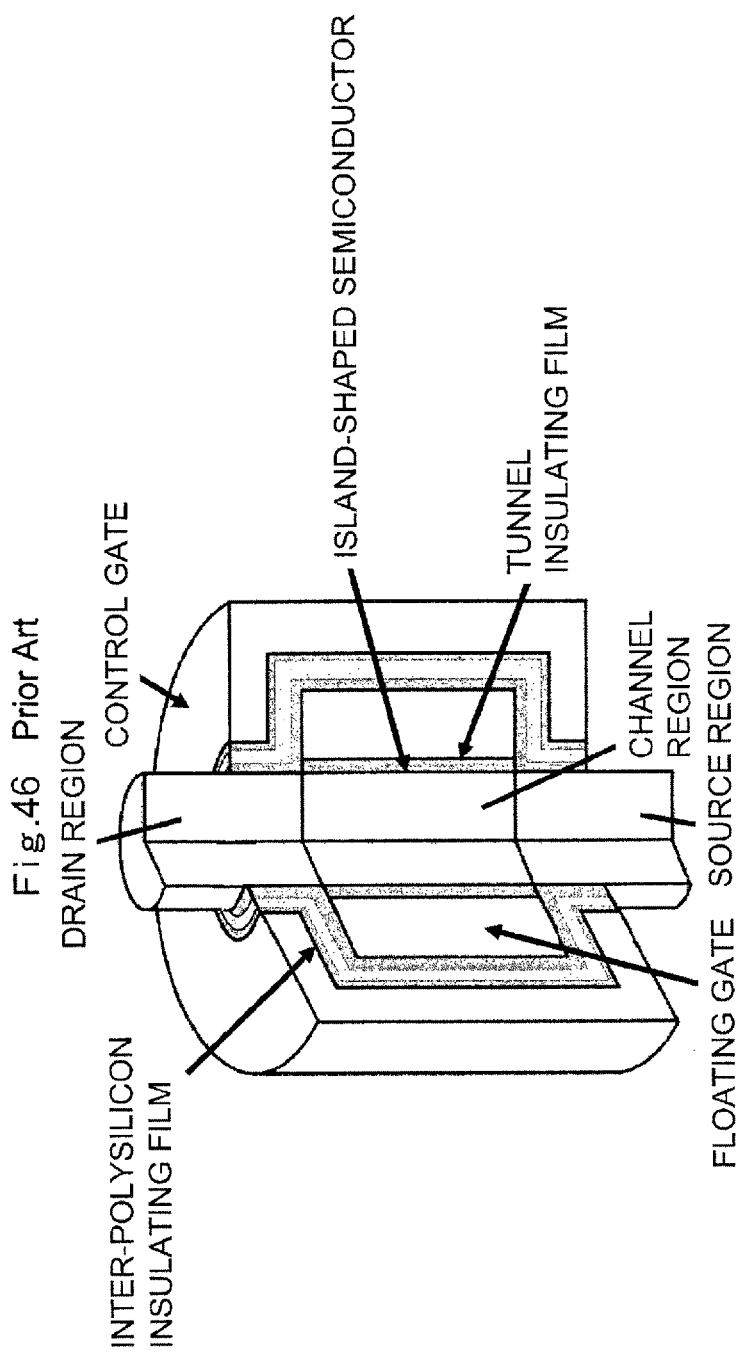
FIG. 46 is a cross-sectional view of an SGT flash memory of the related art.

Subsequently, referring to FIG. 45A to FIG. 45C, the resists 180, 181, and 182 are stripped. Therefore, the formation of the nonvolatile semiconductor memory illustrated in FIG. 2A to FIG. 2C is completed.

It is to be understood that the present invention can embrace various embodiments and modifications without departing from the broad spirit and scope of the present invention. In addition, the foregoing embodiment is used to describe an example of the present invention, and is not intended to limit the scope of the present invention.

The invention claimed is:

1. A nonvolatile semiconductor memory transistor comprising:
   an island-shaped semiconductor having a channel region;
   a floating gate surrounding an outer periphery of the channel region and a tunnel insulating film interposed between the floating gate and the channel region;
   a control gate surrounding an outer periphery of the floating gate and an inter-polysilicon insulating film interposed between the control gate and the floating gate; and
   a control gate line electrically connected to the control gate and extending in a predetermined direction,
   wherein the inter-polysilicon insulating film is interposed between the floating gate and a lower surface and an inner side surface of the control gate and between the floating gate and a lower surface of the control gate line.

\* \* \* \* \*